(12) United States Patent
Matsumoto et al.

(10) Patent No.: US 10,020,159 B2
(45) Date of Patent: Jul. 10, 2018

(54) MULTI CHARGED PARTICLE BEAM WRITING METHOD AND MULTI CHARGED PARTICLE BEAM WRITING APPARATUS

(71) Applicant: NuFlare Technology, Inc., Yokohama (JP)

(72) Inventors: Hiroshi Matsumoto, Kanagawa (JP); Tomohiro Iijima, Shizuoka (JP); Munehiro Ogasawara, Kanagawa (JP); Hideo Inoue, Kanagawa (JP); Ryoichi Yoshikawa, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 15/384,021

(22) Filed: Dec. 19, 2016

(65) Prior Publication Data

US 2017/0098524 A1    Apr. 6, 2017

Related U.S. Application Data

(62) Division of application No. 14/885,726, filed on Oct. 16, 2015, now Pat. No. 9,570,267, which is a division
(Continued)

(30) Foreign Application Priority Data

Nov. 2, 2012   (JP) .................................. 2012-242644
Jun. 13, 2013  (JP) .................................. 2013-124435

(51) Int. Cl.
   *H01J 37/317*   (2006.01)
   *H01J 37/04*    (2006.01)

(52) U.S. Cl.
   CPC ........ *H01J 37/045* (2013.01); *H01J 37/3174* (2013.01); *H01J 37/3177* (2013.01);
   (Continued)

(58) Field of Classification Search
   None
   See application file for complete search history.

(56) References Cited

U.S. PATENT DOCUMENTS 5,260,579 A    11/1993  Yasuda et al.
6,069,971 A *   5/2000  Kanno ..................... G03F 1/20
                                                     348/129
(Continued)

FOREIGN PATENT DOCUMENTS

CN    1607640 A    4/2005
JP    01094619     4/1989
(Continued)

OTHER PUBLICATIONS

Office Action dated Feb. 6, 2017 in German Patent Application No. 10 2013 221 950.4 (with English language translation).
(Continued)

*Primary Examiner* — Michael Logie
(74) *Attorney, Agent, or Firm* — Oblon, McClelland, Maier & Neustadt, L.L.P.

(57) ABSTRACT

A multi charged particle beam writing method includes performing ON/OFF switching of a beam by an individual blanking system for the beam concerned, for each beam in multi-beams of charged particle beam, with respect to each time irradiation of irradiation of a plurality of times, by using a plurality of individual blanking systems that respectively perform beam ON/OFF control of a corresponding beam in the multi-beams, and performing blanking control, in addition to the performing ON/OFF switching of the beam for the each beam by the individual blanking system, with respect to the each time irradiation of the irradiation of the plurality of times, so that the beam is in an ON state during an irradiation time corresponding to irradiation concerned, by using a common blanking system that collec-
(Continued)

tively performs beam ON/OFF control for a whole of the multi-beams.

3 Claims, 21 Drawing Sheets

Related U.S. Application Data of application No. 14/066,940, filed on Oct. 30, 2013, now Pat. No. 9,202,673.

(52) U.S. Cl.
CPC .............. *H01J 2237/0432* (2013.01); *H01J 2237/0435* (2013.01); *H01J 2237/31771* (2013.01); *H01J 2237/31774* (2013.01)

(56) References Cited

U.S. PATENT DOCUMENTS

| | | | |
|---|---|---|---|
| 6,556,702 B1 | 4/2003 | Rishton | |
| 6,835,937 B1* | 12/2004 | Muraki | B82Y 10/00 250/396 R |
| 8,258,484 B2 | 9/2012 | Wieland et al. | |
| 8,492,732 B2 | 7/2013 | Ogasawara | |
| 8,586,951 B2 | 11/2013 | Yoshikawa et al. | |
| 8,710,467 B2 | 4/2014 | Yoshikawa et al. | |
| 2002/0011574 A1 | 1/2002 | Nakasugi | |
| 2002/0027198 A1* | 3/2002 | Nagata | H01J 37/3026 250/307 |
| 2002/0045132 A1 | 4/2002 | Inoue et al. | |
| 2003/0025088 A1 | 2/2003 | Oae et al. | |
| 2003/0155534 A1* | 8/2003 | Platzgummer | B82Y 10/00 250/492.22 |
| 2004/0061080 A1 | 4/2004 | Hashimoto et al. | |
| 2004/0143356 A1 | 7/2004 | Yoda et al. | |
| 2005/0072941 A1 | 4/2005 | Tanimoto et al. | |
| 2005/0242302 A1* | 11/2005 | Platzgummer | B82Y 10/00 250/492.22 |
| 2005/0242303 A1* | 11/2005 | Platzgummer | B82Y 10/00 250/492.22 |
| 2008/0237460 A1 | 10/2008 | Fragner | |
| 2009/0134343 A1 | 5/2009 | Inoue | |
| 2009/0200495 A1* | 8/2009 | Platzgummer | B82Y 10/00 250/492.22 |
| 2012/0286168 A1 | 11/2012 | Derks et al. | |
| 2012/0286173 A1* | 11/2012 | Van De Peut | B82Y 10/00 250/492.1 |
| 2013/0078577 A1 | 3/2013 | Yamazaki | |
| 2014/0014852 A1 | 1/2014 | Wieland et al. | |

FOREIGN PATENT DOCUMENTS

| | | |
|---|---|---|
| JP | 2004-040076 | 2/2004 |
| JP | 2004-71690 | 3/2004 |
| JP | 2006-261342 | 9/2006 |
| JP | 2008-028099 | 2/2008 |
| JP | 2008-210897 | 9/2008 |
| JP | 4220209 | 11/2008 |
| JP | 2009-532887 | 9/2009 |
| JP | 2012-023411 | 2/2012 |

OTHER PUBLICATIONS

Office Action dated May 13, 2015 in Taiwanese Patent Application No. 102138088 (with English translation).
Office Action dated May 25, 2015 in Korean Patent Application No. 10-2013-0131461 (with English translation).
Office Action dated Aug. 29, 2016, in Taiwanese Patent Application No. 104134875 (with English-language translation).
Office Action dated Feb. 7, 2017, in Japanese Patent Application No. 2013-124435, filed Jun. 13, 2013 (w/English-language Translation).

* cited by examiner

| Digit | k | k-1 | k-2 | k-3 | . . . |
|---|---|---|---|---|---|
| Beam 1 | 1 | 1 | 0 | 1 | . . . |
| Beam 2 | 1 | 1 | 0 | 0 | . . . |
| Beam 3 | 0 | 1 | 1 | 0 | . . . |
| Beam 4 | 0 | 1 | 1 | 1 | . . . |
| Beam 5 | 1 | 0 | 1 | 1 | . . . |
| ⋮ | | | | | |

FIG. 7

Stripe Width

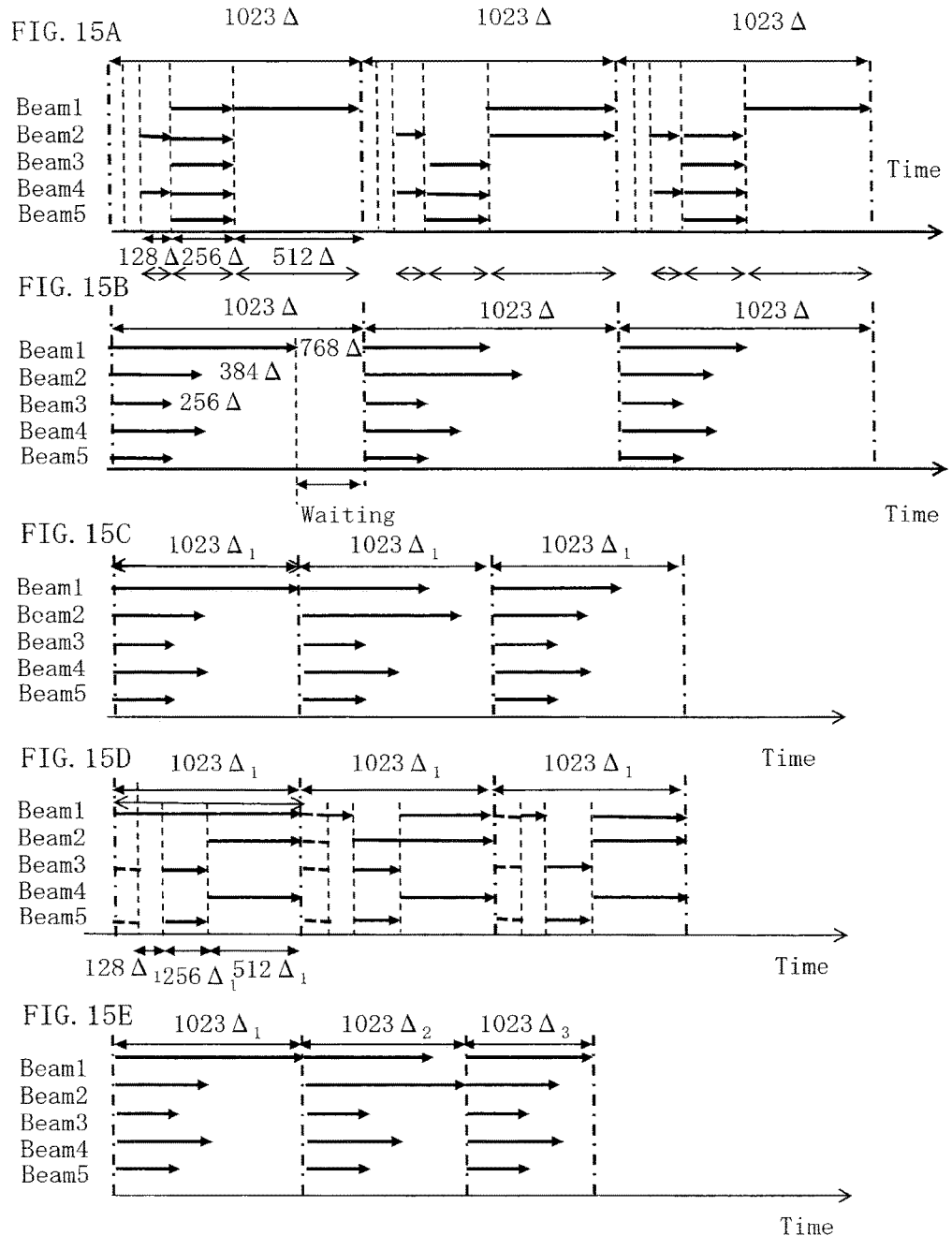

MULTI CHARGED PARTICLE BEAM WRITING METHOD AND MULTI CHARGED PARTICLE BEAM WRITING APPARATUS

CROSS-REFERENCE TO RELATED APPLICATION

This application is a divisional of U.S. application Ser. No. 14/885,726 filed Oct. 16, 2015, which is a divisional of U.S. application Ser. No. 14/066,940 filed Oct. 30, 2013, and is based upon and claims the benefit of priority from the prior Japanese Patent Application No. 2012-242644 filed on Nov. 2, 2012 in Japan, and the prior Japanese Patent Application No. 2013-124435 filed on Jun. 13, 2013 in Japan, the entire contents of each of which are incorporated herein by reference.

BACKGROUND OF THE INVENTION

Field of the Invention

The present invention relates to a multi charged particle beam writing method and a multi charged particle beam writing apparatus. For example, it relates to a blanking method in multi beam writing.

Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with an electron beam.

As an example employing the electron beam writing technique, there is a writing apparatus using multiple beams (multi-beams). Compared with the case of writing a pattern by using an electron beam, since a multi-beam writing apparatus can emit multiple radiation beams at a time, it is possible to greatly increase the throughput. In such a writing apparatus of a multi-beam system, for example, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Patent Application Laid-open (JP-A) No. 2006-261342).

In the multi-beam writing, when performing highly precise writing, the dose of an individual beam is individually controlled by an irradiation time in order to give a specified dose onto each position on a target object. For highly accurately controlling the dose of each beam, it is necessary to carry out blanking control at high speed to perform a beam ON/OFF control. Conventionally, in a writing apparatus of a multi-beam system, a blanking control circuit for each beam is placed on a blanking plate where each blanking electrode of multiple beams is arranged. Controlling is independently performed for each beam. For example, a trigger signal for causing a beam to be ON is sent to control circuits of all the beams. In responsive to the trigger signal, the control circuit of each beam applies a beam-on voltage to an electrode and, simultaneously, starts counting the irradiation time period by a counter. Then, when the irradiation time has been completed, a beam-off voltage is applied. In performing such a control, a ten-bit control signal has been used, for example. However, since the space for placing a circuit on a blanking plate and the amount of current to be used are restricted, there is no other alternative but to have an uncomplicated circuit for the amount of information of control signals. Therefore, it has been difficult to build in a blanking circuit that can perform an operation of high speed and high precision. Further, installing a blanking control circuit for each beam on a blanking plate restricts to narrow the pitch of multiple beams. By contrast, when placing a control circuit for each beam outside the blanking plate and connecting them by wiring in order to secure a space for installing the circuit, since the wiring becomes long, there is a problem that crosstalk increases and writing precision degrades.

BRIEF SUMMARY OF THE INVENTION

In accordance with one aspect of the present invention, a multi charged particle beam writing method includes performing ON/OFF switching of a beam by an individual blanking system for the beam concerned, for each beam in multi-beams of charged particle beam, with respect to each time irradiation of irradiation of a plurality of times, by using a plurality of individual blanking systems that respectively perform beam ON/OFF control of a corresponding beam in the multi-beams, and performing blanking control, in addition to the performing ON/OFF switching of the beam for the each beam by the individual blanking system, with respect to the each time irradiation of the irradiation of the plurality of times, so that the beam is in an ON state during an irradiation time corresponding to irradiation concerned, by using a common blanking system that collectively performs beam ON/OFF control for a whole of the multi-beams.

In accordance with another aspect of the present invention, a multi charged particle beam writing method includes converting, for each shot, an irradiation time of each beam of multi-beams of charged particle beam into a binary number whose number of digits is a predetermined number, and dividing, for the each shot of each beam, irradiation of a beam concerned into irradiation of a number of times equal to the number of digits, where the irradiation of the number of times equal to the number of digits is equivalent to a combination of irradiations of irradiation time periods of the digits each indicating an irradiation time period defined by a decimal number converted from the converted binary number of a corresponding digit, and irradiating the beam of the irradiation time period corresponding to the each digit onto a target object in order.

Further, in accordance with another aspect of the present invention, a multi charged particle beam writing apparatus includes an aperture member in which a plurality of openings are provided to form multi-beams by being irradiated with a charged particle beam, a plurality of individual blanking systems each configured to respectively perform beam ON/OFF control of a corresponding beam in the multi-beams, a common blanking system configured to collectively perform beam ON/OFF control for a whole of the multi-beams, and a control unit configured to control the common blanking system so that the common blanking system specifies irradiation time.

Moreover, in accordance with another aspect of the present invention, a multi charged particle beam writing method includes outputting a first ON/OFF control signal for a beam by a first logic circuit for the beam, for each beam in multi-beams of charged particle beam, with respect to each time irradiation of irradiation of a plurality of times, by using a plurality of first logic circuits each respectively outputs a beam ON/OFF control signal to control a corresponding beam in the multi-beams, outputting a second ON/OFF control signal for a beam, with respect to the each time irradiation of the irradiation of the plurality of times, in addition to switching the first ON/OFF control signal for the each beam by the plurality of first logic circuits, so that the beam is in an ON state during an irradiation time corresponding to irradiation concerned, by using a second logic circuit that collectively outputs a beam ON/OFF control signal to control a whole of the multi-beams, and performing blanking control so that the beam concerned is in an ON state during an irradiation time corresponding to the irradiation concerned in the case both the first ON/OFF control signal and the second ON/OFF control signal are ON control signals.

Furthermore, in accordance with another aspect of the present invention, a multi charged particle beam writing apparatus includes an aperture member in which a plurality of openings are provided to form multi-beams by being irradiated with a charged particle beam, a first logic circuit configured to individually output a first ON/OFF control signal to control a corresponding beam in the multi-beams, a second logic circuit configured to collectively output a second ON/OFF control signal to control a whole of the multi-beams, and a plurality of individual blanking systems each configured, in the case both the first ON/OFF control signal and the second ON/OFF control signal are ON control signals, to respectively perform ON/OFF control of a beam, for the each beam, so that the beam concerned is in an ON state during an irradiation time corresponding to irradiation concerned.

Furthermore, in accordance with another aspect of the present invention, a multi charged particle beam writing method includes generating, respectively, for each shot, irradiation time arrangement data, while using a sequence whose number of terms is a predetermined number, so that a total of values obtained by selecting or not selecting a value of each term of the sequence becomes an irradiation time of each beam of multi-beams of charged particle beam, wherein each value of the sequence is less than or equal to a value obtained by adding 1 to a sum of previous values up to a value just before the each value concerned, and dividing, for each beam shot, irradiation of a beam concerned into irradiation performed a number of times equal to the number of terms of the sequence, wherein the sequence is equivalent to a combination of irradiations of irradiation time periods of the terms each indicating an irradiation time period of a corresponding value of the sequence, and irradiating the beam of the irradiation time period corresponding to a value of each selected term onto a target object in order, based on the irradiation time arrangement data.

BRIEF DESCRIPTION OF THE DRAWINGS

FIG. 7 shows an example of a part of irradiation time arrangement data according to the first embodiment;

FIGS. 15A to 15E are time charts for comparing the exposure waiting time, using a comparative example, according to the second embodiment;

DETAILED DESCRIPTION OF THE INVENTION

In the following Embodiments, there will be described a configuration in which an electron beam is used as an example of a charged particle beam. However, the charged particle beam is not limited to the electron beam, and other charged particle beam such as an ion beam may also be used.

Moreover, in the following Embodiments, there will be described a writing apparatus and method that can increase the precision of controlling a dose while maintaining the restriction on a circuit installation space.

First Embodiment

Figure 1:
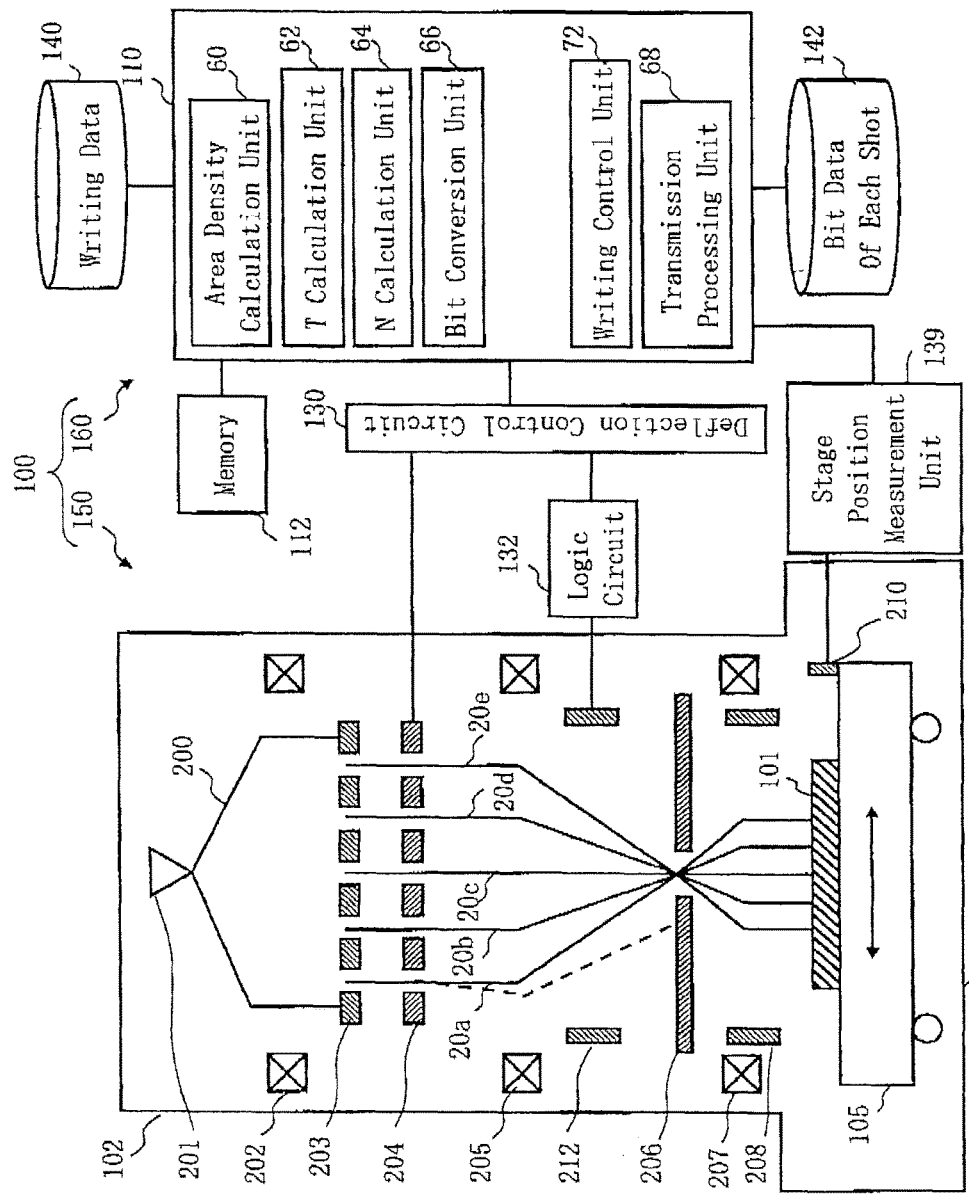
FIG. 1 is a schematic diagram showing a configuration of a writing apparatus according to the first embodiment.

FIG. 1 is a schematic diagram showing a configuration of a writing apparatus according to the first embodiment. Referring to FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 204, a reducing lens 205, a deflector 212, a limiting aperture member 206, an objective lens 207, and a deflector 208. In the writing chamber 103, there is arranged an XY stage 105. On the XY stage, there is placed a target object or "sample" 101 such as a mask serving as a writing target substrate when performing writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, further, there is arranged a mirror 210 for measuring a position.

The control unit 160 includes a control computer 110, a memory 112, a deflection control circuit 130, a logic circuit 132, a stage position measurement unit 139, and storage devices 140 and 142, such as magnetic disk drives. The control computer 110, the memory 112, the deflection control circuit 130, the stage position measurement unit 139, and the storage devices 140 and 142 are mutually connected through a bus (not shown). Writing data is input into the storage device 140 (storage unit) from the outside to be stored therein.

In the control computer 110, there are arranged an area density calculation unit 60, an irradiation time calculation unit 62, a gray level value calculation unit 64, a bit conversion unit 66, a writing control unit 72, and a transmission processing unit 68. Each function, such as the area density calculation unit 60, the irradiation time calculation unit 62, the gray level value calculation unit 64, the bit conversion unit 66, the writing control unit 72, or the transmission processing unit 68 may be configured by hardware such as an electronic circuit, or by software such as a program implementing these functions. Alternatively, they may be configured by a combination of software and hardware. Data which is input and output to/from the area density calculation unit 60, the irradiation time calculation unit 62, the gray level value calculation unit 64, the bit conversion unit 66, the writing control unit 72, and the transmission processing unit 68, and data being calculated are stored in the memory 112 each time.

FIG. 1 shows a structure necessary for explaining the first embodiment. Other structure elements generally necessary for the writing apparatus 100 may also be included.

Figure 2A:
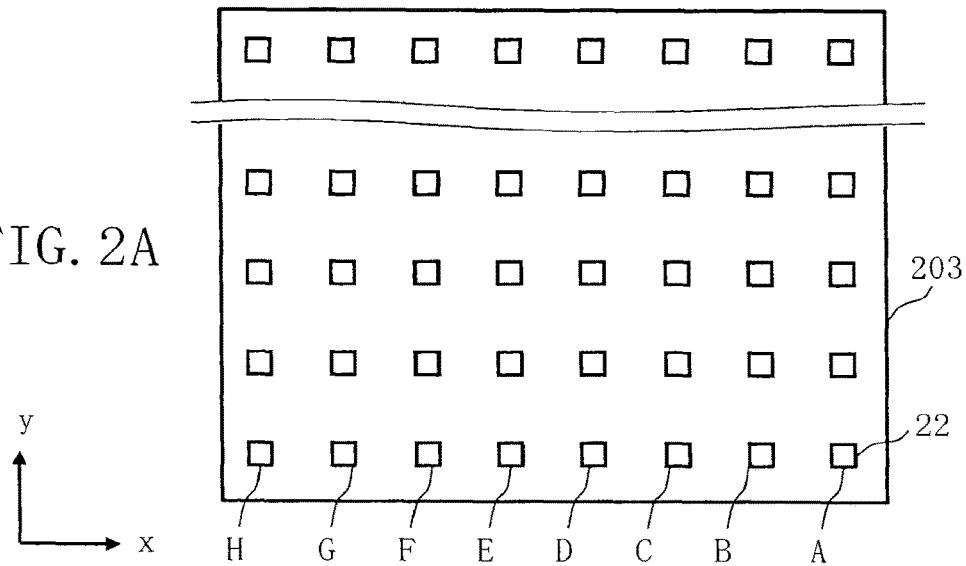
FIGS. 2A and 2B are conceptual diagrams each showing a configuration of an aperture member according to the first embodiment.
Figure 2B:
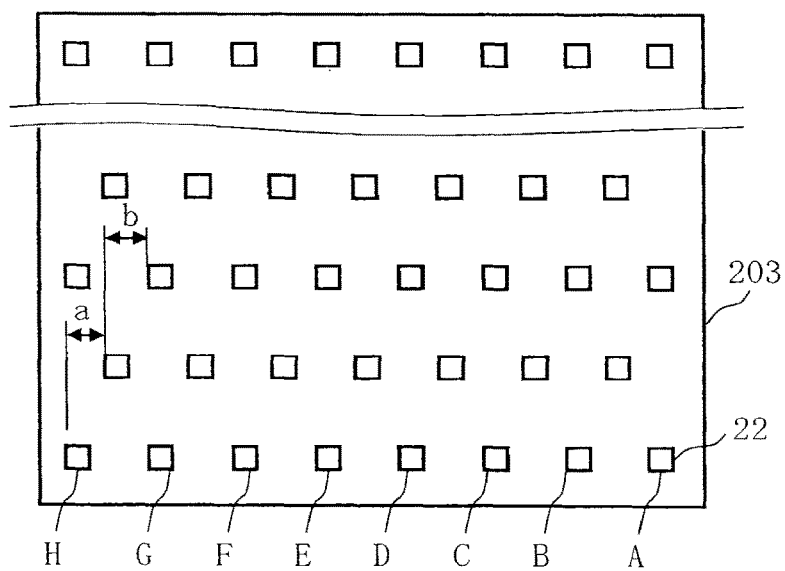

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 is a quadrangle of the same dimensions and shape. Alternatively, each hole may be a circle of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
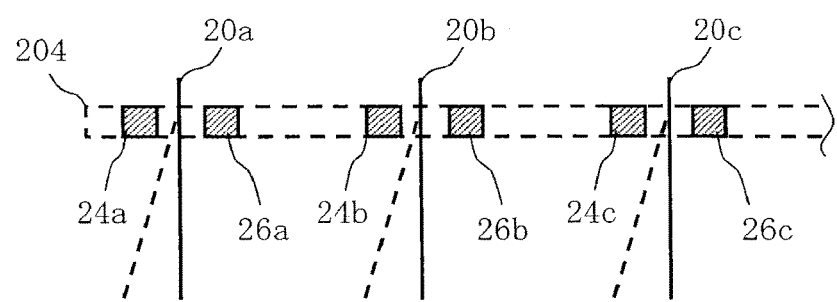
FIG. 3 is a conceptual diagram showing a configuration of a blanking plate according to the first embodiment.
Figure 4:
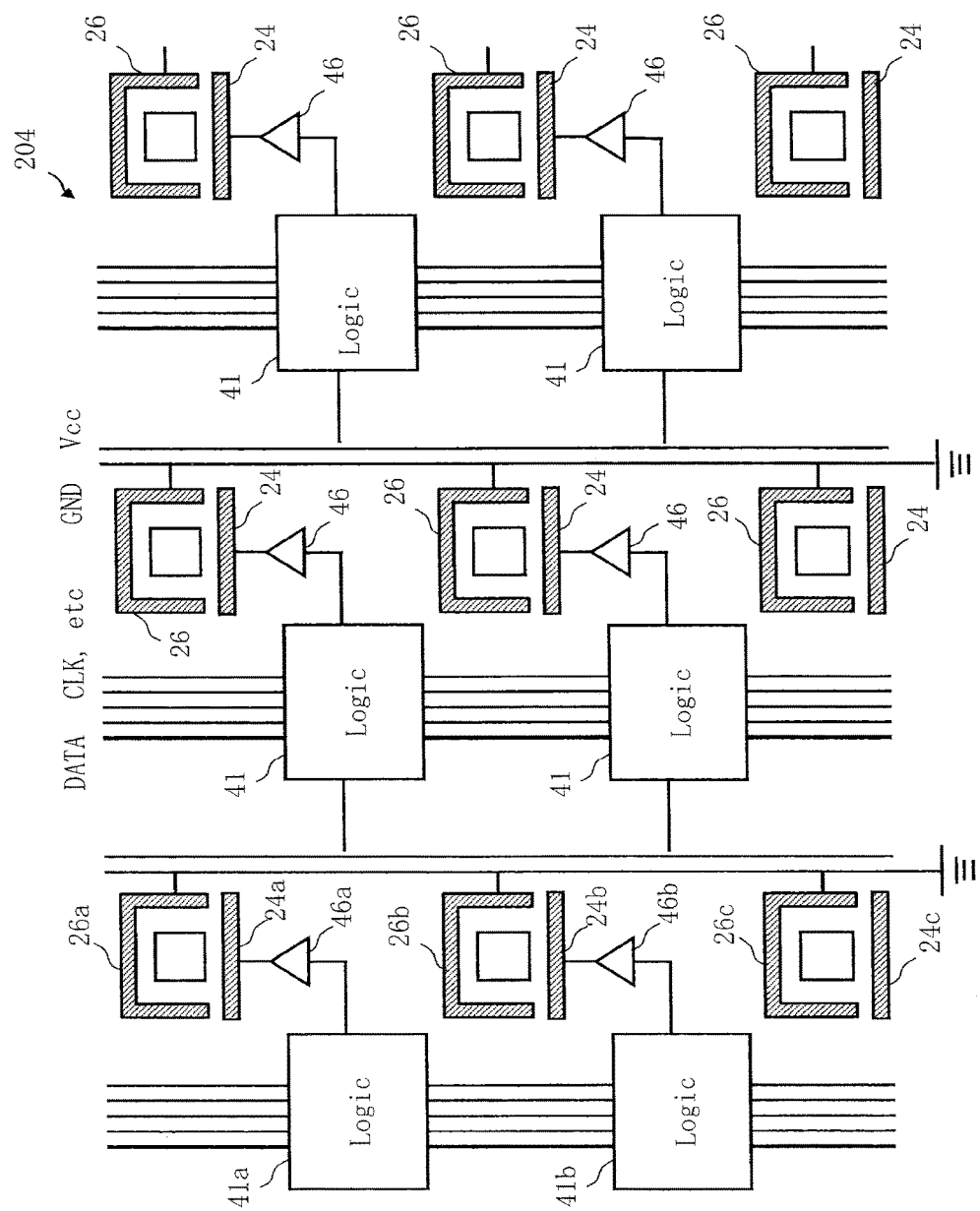
FIG. 4 is a top view conceptual diagram showing a configuration of a blanking plate according to the first embodiment.

FIG. 3 is a conceptual diagram showing the configuration of a blanking plate according to the first embodiment. FIG. 4 is a top view conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blanker: blanking deflector) is arranged for each passage hole. An amplifier 46 for applying voltage is respectively arranged at one (for example, the electrode 24) of the two electrodes 24 and 26 for each beam. A logic circuit 41 is independently arranged at the amplifier 46 for each beam respectively. The other one (for example, the electrode 26) of the two electrodes 24 and 26 for each beam is grounded. An electron beam 20 passing through a corresponding passage hole is respectively deflected by the voltage applied to the two electrodes 24 and 26 being a pair. Blanking control is performed by this deflection. Thus, a plurality of blankers respectively perform blanking deflection of a corresponding beam in the multiple beams having passed through a plurality of holes 22 (openings) of the aperture member 203.

Figure 5:
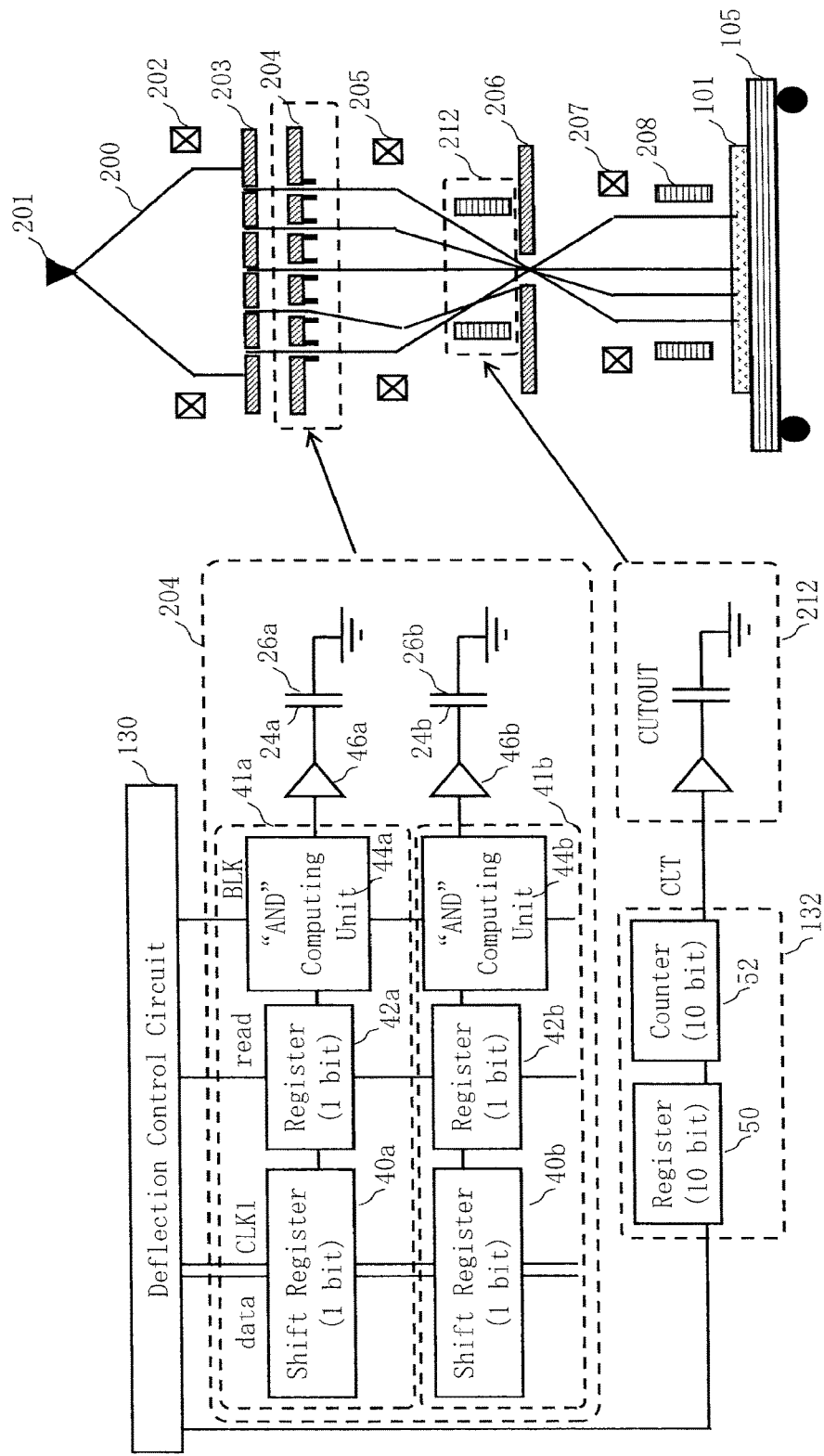
FIG. 5 is a schematic diagram showing an internal structure of an individual blanking control circuit and a common blanking control circuit according to the first embodiment.

FIG. 5 is a schematic diagram showing the internal structure of an individual blanking control circuit and a common blanking control circuit according to the first embodiment. Referring to FIG. 5, a shift register 40, a register 42, and an AND computing unit 44 (logical product computing unit) are arranged in each logic circuit 41 for individual blanking control arranged at the blanking plate 204 in the body of the writing apparatus 100. The AND computing unit 44 is used, for example, when a problem occurs in the register operation, in order to compulsorily make all the individual blanking be beam OFF state, but it may be omitted in the first embodiment. According to the first embodiment, a one-bit control signal is used for individual blanking control for each beam, which has conventionally been controlled by, for example, a ten-bit control signal. That is, a one-bit control signal is input/output into/from the shift register 40, the register 42, and the AND computing unit 44. Since the amount of information of a control signal is small, an installation area of the control circuit can be made small. In other words, even when a logic circuit is arranged on the blanking plate 204 whose installation space is small, more beams can be arranged at a smaller beam pitch. This enables the amount of current passing the blanking plate to be increased, and therefore, a writing throughput can be improved.

Moreover, an amplifier is arranged at the deflector 212 for common blanking, and a register 50 and a counter 52 (an example of a shot time control unit) are arranged at the logic circuit 132. These do not perform plural different controlling at the same time, and therefore, it is sufficient to use one circuit to perform ON/OFF control. Accordingly, even when arranging a circuit for a high speed response, no problem occurs with respect to the restriction on the installation space and the current to be used in the circuit. Therefore, this amplifier is operated at very high speed compared with an amplifier realizable on a blanking aperture. This amplifier is controlled by a ten-bit control signal, for example. That is, for example, a ten-bit control signal is input/output into/from the register 50 and the counter 52.

According to the first embodiment, blanking control of each beam is performed by using both the beam ON/OFF control by each logic circuit 41 for individual blanking control described above and the beam ON/OFF control by the logic circuit 132 for common blanking control that collectively control all the multiple beams.

Figure 6:
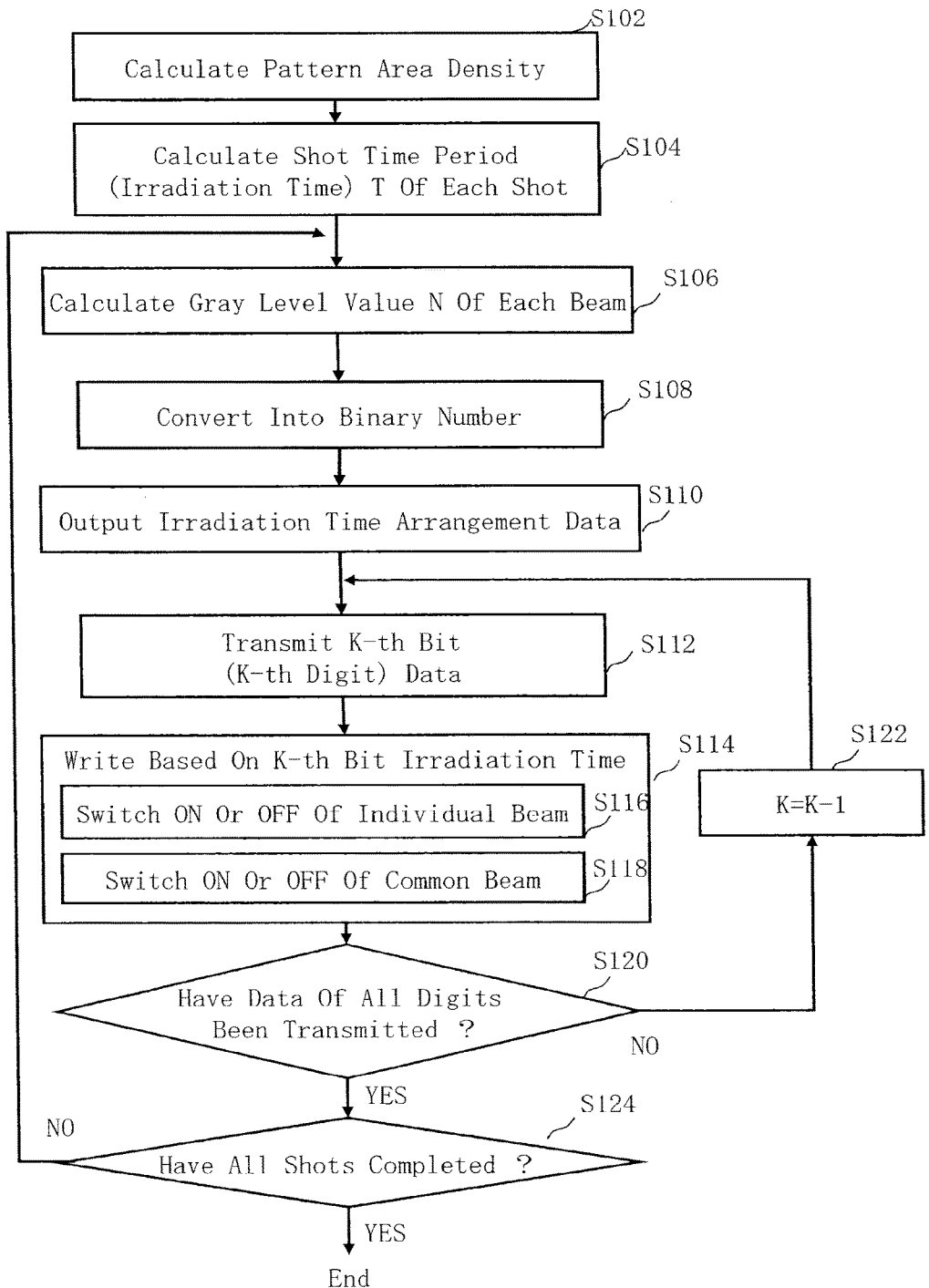
FIG. 6 is a flowchart showing main steps of a writing method according to the first embodiment.

FIG. 6 is a flowchart showing main steps of a writing method according to the first embodiment. In FIG. 6, a series of steps: a pattern area density calculation step (S102), a shot time period (irradiation time) T calculation step (S104), a gray level value N calculation step (S106), a conversion to binary number step (S108), an irradiation time arrangement data output step (S110), a target digit data transmission step (S112), a writing step (S114) based on irradiation time of a target digit, a determination step (S120), a digit change step (S122), and a determination step (S124) are executed. The writing step (S114) based on irradiation time of a target digit executes, as its internal steps, a series of steps: an individual beam ON/OFF switching step (S116) and a common beam ON/OFF switching step (S118).

In the pattern area density calculation step (S102), the area density calculation unit 60 reads writing data from the storage device 140, and calculates the area density of a pattern arranged in the writing region of the target object 101 or in each mesh region of a plurality of mesh regions made by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The area density calculation unit 60 reads corresponding writing data from the storage device 140 for each stripe region, and assigns a plurality of figure patterns defined in the writing data to a mesh region, for example. Then, the area density of a figure pattern arranged in each mesh region is to be calculated.

In the shot time period (irradiation time) T calculation step (S104), the irradiation time calculation unit 62 calculates an irradiation time T (which hereinafter will also be called a shot time period or an exposure time) of the electron beam per shot, for each predetermined sized mesh region. When performing multi-pass writing, an irradiation time T of the electron beam per shot in each hierarchy (or "each writing process") of multi-pass writing is to be calculated. It is preferable to obtain an irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations, such as a proximity effect, a fogging effect, or a loading effect not shown. The size of a plurality of mesh regions for defining the irradiation time T and the size of a plurality of mesh regions where a pattern area density is defined may be the same size or different sizes. When they are different sizes, each irradiation time T is calculated after interpolating an area density by linear interpolation, etc. The irradiation time T for each mesh region is defined in an irradiation time map, and the irradiation time map is stored in the storage device 142, for example.

In the gray level value N calculation step (S106), the gray level value calculation unit 64 calculates a gray level value N being an integer at the time of defining the irradiation time T for each mesh region, defined in the irradiation time map, by using a predetermined quantization unit Δ. The irradiation time T is defined by the following equation (1).

$$T = \Delta N \tag{1}$$

Therefore, the gray level value N is defined as an integer value obtained by dividing the irradiation time T by a quantization unit Δ. The quantization unit Δ can be variously set, and, for example, it can be defined by 1 ns (nanosecond), etc., for example. It is preferable that a value of 1 to 10 ns, for example, is used as the quantization unit Δ. Δ indicates a quantization unit for controlling, such as a clock period, in the case of performing control by a counter.

In the conversion to binary number step (S108), the bit conversion unit 66 converts, for each shot, the irradiation time (in this case, a gray level value N) of each of multiple beams into a predetermined n-digit binary value. For example, when N=50, since it is $50=2^1+2^4+2^5$, if converting into a 10-digit binary value, it becomes "0000110010". For example, if N=500, it is "0111110100". For example, if N=700, it is "1010111100". For example, if N=1023, it is "1111111111". For each shot, the irradiation time of each beam is equivalent to an irradiation time defined for a mesh region to be irradiated by each beam concerned. Thereby, the irradiation time T is defined by the following equation (2).

$$T = \Delta \sum_{k=0}^{n-1} a_k 2^k \tag{2}$$

$a_k$ indicates a value (1 or 0) of each digit in the case defining the gray level value N by a binary number. Although it is sufficient for n, being the number of digits, to be two or more, preferably it should be four or more digits, and more preferably, it should be eight or more digits.

According to the first embodiment, for each beam shot, irradiation of each beam shot concerned is divided into irradiation of n times, where n indicates the number of digits of a binary number sequence, wherein the irradiation of n times is equivalent to a combination of irradiations of the irradiation time periods of the digits each indicating an irradiation time period defined by a decimal number converted from a binary number of a corresponding digit of the n-digit binary number having been converted. In other words, one shot is divided into a plurality of irradiation steps of irradiation time periods of $\Delta a_0 2^0$, $\Delta a_1 2^1$, ..., $\Delta a_k 2^k$, $\Delta a_{n-1} 2^{n-1}$. In the case of n, the number of digits, being 10, that is n=10, one shot is divided into irradiation steps of ten times.

For example, in the case of n, the number of digits, being 10, that is n=10, if N=700, the irradiation time of the tenth digit (the tenth bit) is Δ×512. The irradiation time of the ninth digit (the ninth bit) is Δ×0=0. The irradiation time of the eighth digit (the eighth bit) is Δ×128. The irradiation time of the seventh digit (the seventh bit) is Δ×0=0. The irradiation time of the sixth digit (the sixth bit) is Δ×32. The irradiation time of the fifth digit (the fifth bit) is Δ×16. The irradiation time of the fourth digit (the fourth bit) is Δ×8. The irradiation time of the third digit (the third bit) is Δ×4. The irradiation time of the second digit (the second bit) is Δ×0=0. The irradiation time of the first digit (the first bit) is Δ×0=0.

For example, in the case of performing irradiation in order from the largest digit, if Δ=1 ns, the first irradiation step is 512 ns (beam ON) irradiation. The second irradiation step is 0 ns (beam OFF) irradiation. The third irradiation step is 128 ns (beam ON) irradiation. The fourth irradiation step is 0 ns (beam OFF) irradiation. The fifth irradiation step is 32 ns (beam ON) irradiation. The sixth irradiation step is 16 ns (beam ON) irradiation. The seventh irradiation step is 8 ns (beam ON) irradiation. The eighth irradiation step is 4 ns (beam ON) irradiation. The ninth irradiation step is 0 ns (beam OFF) irradiation. The tenth irradiation step is 0 ns (beam OFF) irradiation.

As described above, according to the first embodiment, for each beam shot, irradiation of each beam shot concerned is divided into irradiation of n times, where n indicates the number of digits of a binary number sequence, wherein the irradiation of n times is equivalent to a combination of each digit indicating an irradiation time defined by a decimal number converted from the converted binary number of each digit of the n-digit binary number. Then, as described later, the target object 101 is irradiated in order by beam of irradiation time corresponding to each digit.

In the irradiation time arrangement data output step (S110), the transmission processing unit 68 outputs irradiation time arrangement data having been converted into binary data to the deflection control circuit 130, for each beam shot.

In the target digit data transmission step (S112), the deflection control circuit 130 outputs, for each shot, irradiation time arrangement data to the logic circuit 41 for each beam. Moreover, synchronized with this, the deflection control circuit 130 outputs timing data of each irradiation step to the logic circuit 132 for common blanking.

FIG. 7 shows an example of a part of irradiation time arrangement data according to the first embodiment. Referring to FIG. 7, there is shown a part of irradiation time arrangement data of a predetermined shot of beams 1 to 5 in the multiple beams, for example. The example of FIG. 7 shows irradiation time arrangement data of the k-th bit (k-th digit) irradiation step to the (k−3)th bit ((k−3)th digit) irradiation step of the beams 1 to 5. In the example of FIG. 7, as to the beam 1, data "1101" is described for the irradiation steps from the k-th bit (k-th digit) to the (k−3) th bit ((k−3)th digit). As to the beam 2, data "1100" is described for the irradiation steps from the k-th bit (k-th digit) to the (k−3)th bit ((k−3)th digit). As to the beam 3, data "0110" is described for the irradiation steps from the k-th bit (k-th digit) to the (k−3) th bit ((k−3)th digit). As to the beam 4, data "0111" is described for the irradiation steps from the k-th bit (k-th digit) to the (k−3) th bit ((k−3)th digit). As to the beam 5, data "1011" is described for the irradiation steps from the k-th bit (k-th digit) to the (k−3)th bit ((k−3)th digit).

According to the first embodiment, as shown in FIG. 5, since the shift register 40 is used for the logic circuit 41, the deflection control circuit 130 transmits data of the same bit (the same number of digits) to each logic circuit 41 of the blanking plate 204 in the order of beam arrangement (or in the order of identification number). Moreover, a clock signal (CLK1) for synchronization, a read signal (read) for data read-out, and a gate signal (BLK) are output. In the example of FIG. 7, as data of the k-th bit (k-th digit) of the beams 1 to 5, each one bit data of "10011" is transmitted from the posterior beam. The shift register 40 of each beam transmits data to the next shift register 40 in order from the top, based on a clock signal (CLK1). For example, with respect to the data of the k-th bit (k-th digit) of the beams 1 to 5, based on clock signals of five times, "1" being one bit data is stored in the shift register 40 of the beam 1. "1" being one bit data is stored in the shift register 40 of the beam 2. "0" being one bit data is stored in the shift register 40 of the beam 3. "0" being one bit data is stored in the shift register 40 of the beam 4. "1" being one bit data is stored in the shift register 40 of the beam 5.

Next, in response to an input of a read signal (read), the register 42 of each beam reads the data of the k-th bit (k-th digit) of each beam from the shift register 40. In the example of FIG. 7, as the data of the k-th bit (k-th digit), "1" being one bit data is stored in the register 42 of the beam 1. As the data of the k-th bit (k-th digit), "1" being one bit data is stored in the register 42 of the beam 2. As the data of the k-th bit (k-th digit), "0" being one bit data is stored in the register 42 of the beam 3. As the data of the k-th bit (k-th digit), "0 being one bit data is stored in the register 42 of the beam 4. As the data of the k-th bit (k-th digit), "1" being one bit data is stored in the register 42 of the beam 5. When inputting the data of the k-th bit (k-th digit), the individual register 42 of each beam outputs, based on the data, an ON/OFF signal to the AND computing unit 44. If the data of the k-th bit (k-th digit) is "1", an ON signal is output, and if it is "0", an OFF signal is output. Then, when the BLK signal is an ON signal and the signal of the register 42 is ON, the AND computing unit 44 outputs an ON signal to the amplifier 46, and the amplifier 46 applies an ON voltage to the electrode 24 of the individual blanking deflector. In the case other than the above, the AND computing unit 44 outputs an OFF signal to the amplifier 46, and the amplifier 46 applies an OFF voltage to the electrode 24 of the individual blanking deflector.

While the data of the k-th bit (k-th digit) is being processed, the deflection control circuit 130 transmits the data of the (k−1)th bit ((k−1)th digit) to each logic circuit 41 of the blanking plate 204, in the order of beam arrangement (or in the order of identification number). In the example of FIG. 7, as the data of the (k−1)th bit ((k−1)th digit) of the beams 1 to 5, each one bit data of "01111" is transmitted from the posterior beam. The shift register 40 of each beam transmits the data to the next shift register 40 in order from the top, based on a clock signal (CLK1). For example, with respect to the data of the (k−1)th bit ((k−1)th digit) of the beams 1 to 5, based on clock signals of five times, "1" being one bit data is stored in the shift register 40 of the beam 1. "1" being one bit data is stored in the shift register 40 of the beam 2. "1" being one bit data is stored in the shift register 40 of the beam 3. "1" being one bit data is stored in the shift register 40 of the beam 4. "0" being one bit data is stored in the shift register 40 of the beam 5. Based on the read signal of the (k−1)th bit ((k−1)th digit), the register 42 of each beam reads data of the (k−1)th bit ((k−1)th digit) of each beam, from the shift register 40. Similarly, it should go to the data processing of the first bit (the first digit).

The AND computing unit 44 shown in FIG. 5 may be omitted. However, it is effective in that a beam can be controlled to be OFF by the AND computing unit 44 in the case of not being able to make the beam OFF because of a trouble of elements of the logic circuit 41. Although a data transmission channel for one bit where the shift registers are arranged in series is used in FIG. 5, it is also effective to provide a plurality of parallel transmission channels in order to improve the speed of transmission.

In the writing step (S114) based on irradiation time of a target digit, for each beam shot, writing is performed based on the irradiation time of a target digit (for example, the k-th bit (k-th digit)) which is obtained by dividing the irradiation into a plurality of irradiation steps.

Figure 8:
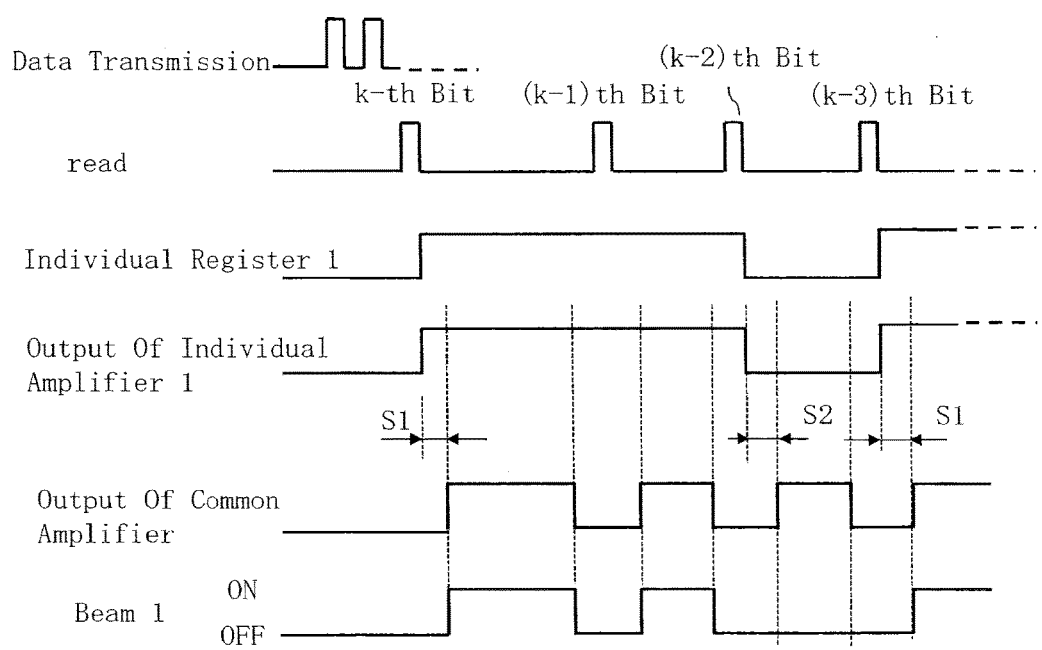
FIG. 8 is a flowchart showing a beam ON/OFF switching operation with respect to a part of an irradiation step of one shot according to the first embodiment.

FIG. 8 is a flowchart showing a beam ON/OFF switching operation with respect to a part of an irradiation step of one shot according to the first embodiment. FIG. 8 shows one beam (beam 1) in multiple beams. In the example of FIG. 7, the irradiation time arrangement data of the k-th bit (k-th digit) to the (k−3)th bit ((k−3)th digit) is represented by "1101". First, in response to an input of a read signal of the k-th bit (the k-th digit), the individual register 42 (individual register 1) outputs an ON/OFF signal based on the stored data of the k-th bit (the k-th digit). Referring to FIG. 8, an ON signal is output. According to the first embodiment, since it is the case of a one-bit signal, with respect to the individual register 42, data output is maintained until the next (k−1)th bit ((k−1)th digit) data is read.

Since the data of the k-th bit (k-th digit) is data indicating ON, the individual amplifier 46 (individual amplifier 1) outputs an ON voltage to be applied to the blanking electrode 24 for the beam 1. On the other hand, in the logic circuit 132 for common blanking, ON or OFF is switched depending upon timing data of ten bits of each irradiation step. In the common blanking system, an ON signal is output during the irradiation time of each irradiation step. For example, if Δ=1 ns, the irradiation time of the first irradiation step (for example, the tenth digit (the tenth bit)) is Δ×512=512 ns. The irradiation time of the second irradiation step (for example, the ninth digit (the ninth bit)) is Δ×256=256 ns. The irradiation time of the third irradiation step (for example, the eighth digit (the eighth bit)) is Δ×128=128 ns. Similarly, an ON signal is output during the irradiation time of each digit (each bit), hereinafter. In the logic circuit 132, when timing data of each irradiation step is input into the register 50, the register 50 outputs data indicating ON of the k-th digit (k-th bit), the counter 52 counts the irradiation time of the k-th digit (k-th bit), and controlling is performed to be OFF after the irradiation time has passed.

In the common blanking system, compared with ON/OFF switching of the individual blanking system, ON/OFF switching is performed after the voltage stabilization time (settling time) S1/S2 of the amplifier 46 has passed. In the example of FIG. 8, after the individual amplifier 1 has become ON and the settling time S1 of the individual amplifier 1 at the time of switching from OFF to ON has passed, the common amplifier becomes ON. Thereby, beam irradiation at an unstable voltage at the time of rise of the individual amplifier 1 can be eliminated. Then, the common amplifier becomes OFF when the irradiation time of the k-th digit (k-th bit) has passed. Consequently, in the case of both the individual amplifier and the common amplifier being ON, an actual beam becomes ON, and irradiates the target object 101. Therefore, it is controlled such that the ON time of the common amplifier becomes the irradiation time of the actual beam. In other words, the common blanking system specifies the irradiation time. That is, it is controlled such that the common amplifier and the deflector 212 specify the irradiation time by using the counter 52 (irradiation time control unit). On the other hand, in the case where the common amplifier becomes ON when the individual amplifier 1 is OFF, after the individual amplifier 1 becomes OFF and the settling time S2 of the individual amplifier 1 at the time of switching from ON to OFF has passed, the common amplifier becomes ON. Thereby, beam irradiation at an unstable voltage at the time of fall of the individual amplifier 1 can be eliminated. As described in FIG. 8, if the operation of the individual amplifier starts after the common amplifier is turned off, an unstable operation can be eliminated and accurate beam irradiation can be executed.

As described above, in the individual beam ON/OFF switching step (S116), beam ON/OFF control is individually performed for a corresponding beam in multiple beams by a plurality of individual blanking systems (blanking plate 204, etc.), and, for each beam, with respect to an irradiation step (irradiation) of the k-th digit (k-th bit), beam ON/OFF switching is performed by the individual blanking system for the beam concerned. In the example of FIG. 8, since the beam is not in the OFF state in the irradiation step of the (k−1)th digit ((k−1)th bit), switching from ON to OFF is not performed. However, for example, if the beam is in the OFF state in the irradiation step of the (k−1) the digit ((k−1)th bit), it should be understood that switching from ON to OFF is performed.

In the common beam ON/OFF switching step (S118), with respect to the irradiation step (irradiation) of the k-th digit (k-th bit), in addition to the performing beam ON/OFF switching for each beam by the individual blanking system, beam ON/OFF controlling is collectively performed by the common blanking system (the logic circuit 132, the deflector 212, etc.) for the whole of the multiple beams, and blanking control is performed so that the beam may be in the ON state during the irradiation time corresponding to the irradiation step (irradiation) of the k-th digit (k-th bit).

As described above, since there is a restriction on the installation area of the circuit and the current to be used in the circuit in the blanking plate 204, a simple amplifier circuit is used. Therefore, it is also limited in reducing the settling time of the individual amplifier. By contrast, in the common blanking system, a highly precise amplifier circuit of sufficient size, current, and scale can be installed outside the lens barrel. Therefore, the settling time of the common amplifier can be shortened. Thus, according to the first embodiment, it is possible to eliminate a voltage unstable time and a noise component containing crosstalk of the individual amplifier on the blanking plate and to perform a blanking operation based on a highly precise irradiation time by, after the beam becomes in the ON state by the individual blanking system (or after a read signal of a target digit is output), letting the beam to be ON by the common blanking system after the settling time has passed.

In the determination step (S120), the writing control unit 72 determines whether transmission of irradiation time arrangement data with respect to all the digits has been completed or not. When it has not been completed yet, it goes to the digit change step (S122). When it has been completed, it goes to the determination step (S124).

In the digit change step (S122), the writing control unit 72 changes a target bit (digit). For example, the target digit is changed to the (k−1)th digit ((k−1)th bit) from the k-th digit (k-th bit). Then, it returns to the target digit data transmission step (S112). With respect to the processing of the (k−1)th digit ((k−1)th bit), the target digit data transmission step (S112) to the digit change step (S122) are executed. Then, it is similarly repeated until processing of irradiation time arrangement data with respect to all the digits have been completed in the determination step (S120).

In the example of FIG. 8, after the beam ON time for the irradiation step of the k-th digit (k-th bit) has passed, a read signal of the (k−1)th digit ((k−1)th bit) is input into the register 42. In the register 42, as to the beam 1, since the data of the (k−1)th digit ((k−1)th bit) "1", it is continued to output an ON signal. Therefore, the output of the individual amplifier 1 becomes ON, and an ON voltage is applied to the electrode 24 for individual blanking. Similarly, after the settling time of the individual amplifier 1 has passed, the beam is made to be ON by the common blanking system. Then, after the irradiation time of the (k−1)th digit ((k−1)th bit) has passed, the beam is made to be OFF by the common blanking system.

Next, after the beam ON time for the irradiation step of the (k−1)th digit ((k−1)th bit) has passed, a read signal of the (k−2)th digit ((k−2)th bit) is input into the register 42. In the register 42, as to the beam 1, since the data of the (k−2)th digit ((k−2)th bit) is "0", it is switched to output an OFF signal. Therefore, the output of the individual amplifier 1 becomes OFF, and an OFF voltage is applied to the electrode 24 for individual blanking. Similarly, after the settling time of the individual amplifier 1 has passed, the beam is made to be ON by the common blanking system. However, since the output of the individual amplifier 1 is OFF, consequently, the beam 1 is made to be OFF. Then, after the irradiation time of the (k−2)th digit ((k−2) th bit) has passed, the beam is made to be OFF by the common blanking system.

Next, after the beam ON time for the irradiation step of the (k−2)th digit ((k−2)th bit) has passed, a read signal of the (k−3)th digit ((k−3)th bit) is input into the register 42. In the register 42, as to the beam 1, since the data of the (k−3)th digit ((k−3)th bit) is "1", it is switched to output an ON signal. Therefore, the output of the individual amplifier 1 becomes ON, and an ON voltage is applied to the electrode 24 for individual blanking. Similarly, after the settling time of the individual amplifier 1 has passed, the beam is made to be ON by the common blanking system. This time, since the output of the individual amplifier 1 is ON, consequently, the beam 1 is made to be ON. Then, after the irradiation time of the (k−3) th digit ((k−3) th bit) has passed, the beam is made to be OFF by the common blanking system.

As described above, for each beam in multiple beams, beam ON/OFF switching is performed by the individual blanking system for the beam concerned, with respect to each time irradiation of irradiation performed the number of times equal to the number of digits (irradiation steps performed the number of times equal to the number of digits), by using a plurality of individual blanking systems that respectively perform beam ON/OFF control of a corresponding beam in the multiple beams. Simultaneously, with respect to each time irradiation of irradiation performed the number of times equal to the number of digits (irradiation steps performed the number of times equal to the number of digits), in addition to the performing beam ON/OFF switching for each beam by the individual blanking system, blanking control is performed so that the state of the beam may be ON during the irradiation time corresponding to irradiation of the digit concerned by using the common blanking system that collectively performs beam ON/OFF control for the whole of multiple beams. By the switching operation of the individual blanking system and the common blanking system, beam of the irradiation time respectively corresponding to each digit irradiates the target object 101 in order.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (the first deflector: individual blanking system) of the blanking plate 204. Each blanker respectively deflects (performs blanking deflection) the electron beam 20 passing individually.

Figure 9:
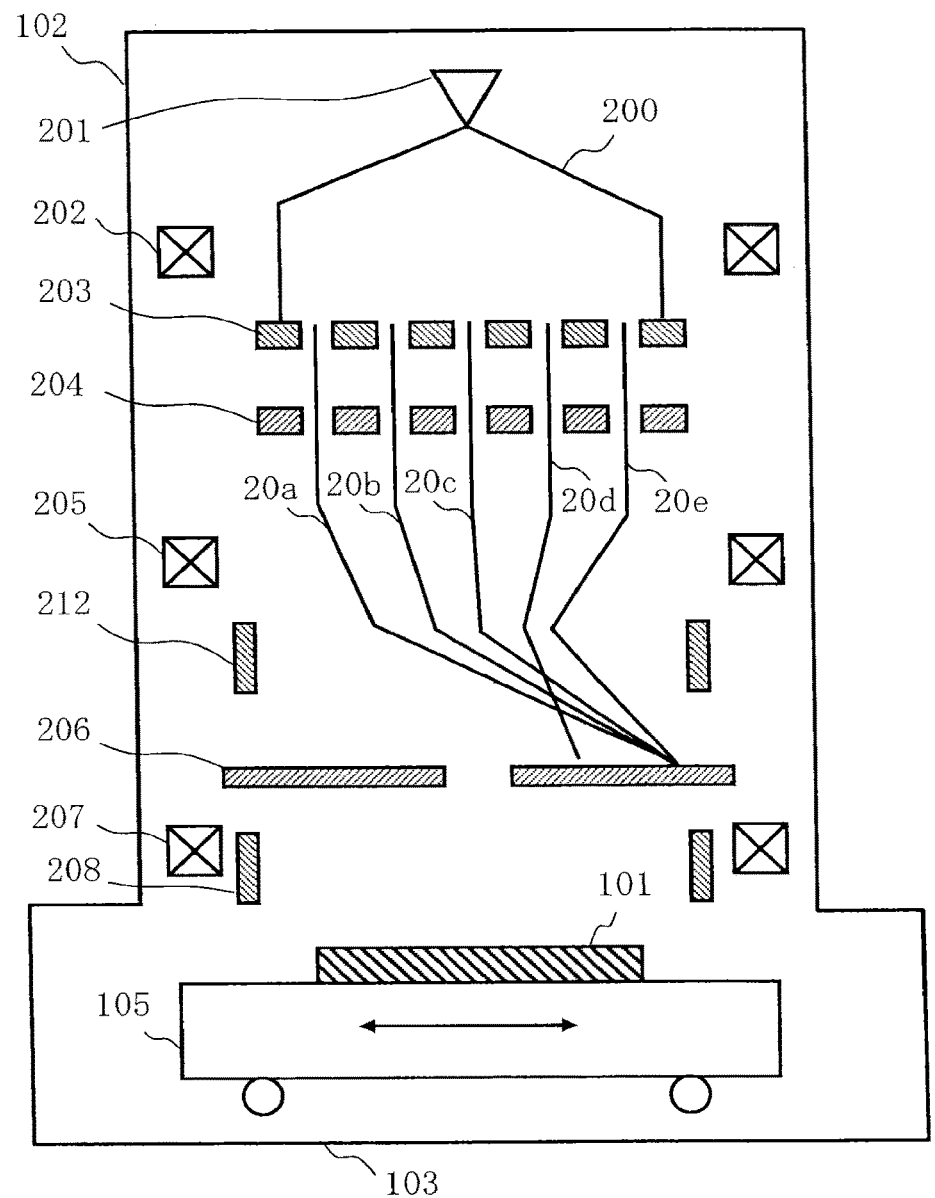
FIG. 9 is a schematic diagram explaining a blanking operation according to the first embodiment.

FIG. 9 is a schematic diagram explaining a blanking operation according to the first embodiment. The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, if the electron beam 20 which was not deflected by the blanker of the blanking plate 204 is not deflected by the deflector 212 (common blanking system), it passes through the hole at the center of the limiting aperture member 206, as shown in FIG. 1. Blanking control is performed by combination of ON/OFF of the individual blanking system and ON/OFF of the common blanking system so as to control ON/OFF of the beam. Thus, the limiting aperture member 206 blocks each beam which was deflected to be a beam OFF state by the individual blanking system or the common blanking system. Then, beam of an irradiation step obtained by dividing one beam shot is formed by beams having been made during from a beam ON state to a beam OFF state and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be ON according to the pattern.

In the determination step (S124), the writing control unit 72 determines whether all the shots have been completed. If all the shots have been completed, it ends. If all the shots have not been completed yet, it returns to the gray level value N calculation step (S106), and the steps from the gray level value N calculation step (S106) to the determination step (S124) are repeated until all the shots have been completed.

Figure 10:
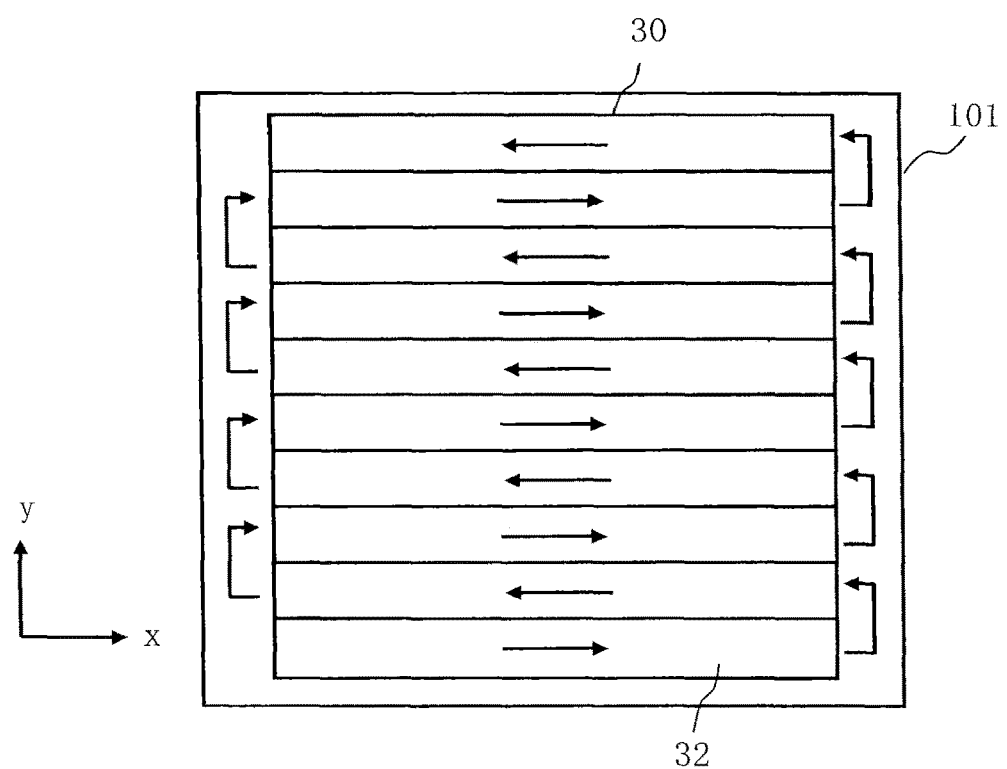
FIG. 10 is a conceptual diagram explaining a writing operation according to the first embodiment.

FIG. 10 is a conceptual diagram explaining a writing operation according to the first embodiment. As shown in FIG. 10, a writing region 30 of the target object 101 is virtually divided into a plurality of strip-shaped stripe regions 32 each having a predetermined width in the y direction, for example. Each of the stripe regions 32 serves as a writing unit region. The XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end and located to be relatively in the y direction. Then, similarly, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, a plurality of shot patterns of the same number as the holes 22 are formed at a time by multiple beams which have been formed by passing through respective corresponding holes 22 of the aperture member 203.

Figure 11A:
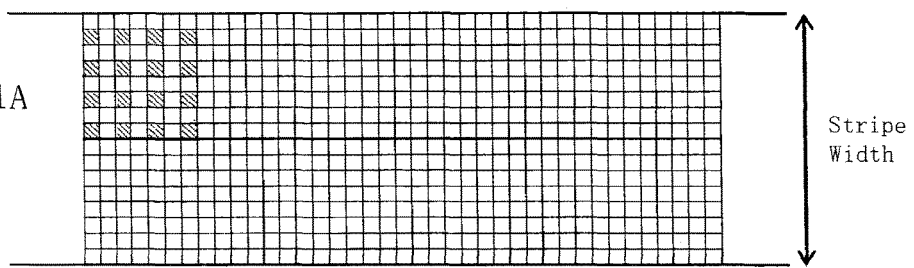
FIGS. 11A to 11C are conceptual diagrams explaining examples of a writing operation in a stripe according to the first embodiment.
Figure 11B:
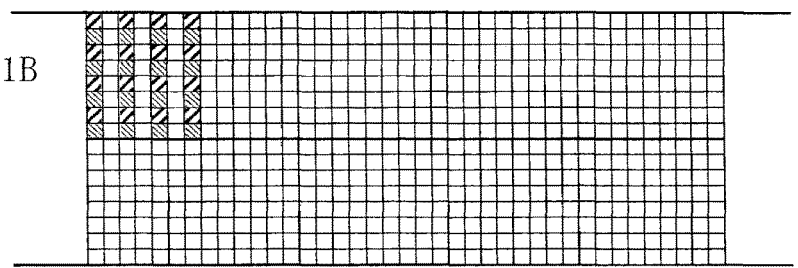
Figure 11C:
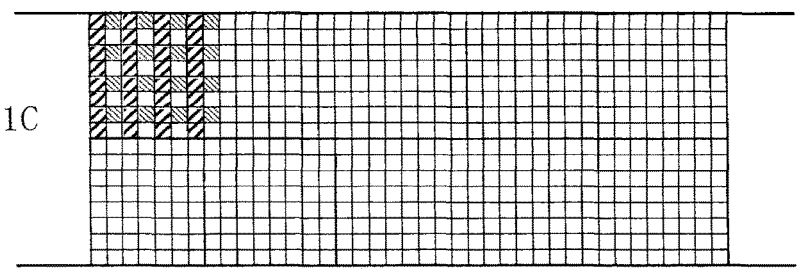

FIGS. 11A to 11C are conceptual diagrams explaining examples of a writing operation in a stripe according to the first embodiment. The examples of FIGS. 11A to 11C show the cases where writing is performed in a stripe by using multiple beams of 4×4 in the x and y directions, for example. The examples of FIGS. 11A to 11C show the cases where a stripe region is divided in the y direction by twice the width of an irradiation region of the whole multi-beam, for example. There is shown the case where exposure (writing) of one irradiation region by the whole of multiple beams is completed by shots of four times (one shot is a total of a plurality of irradiation steps) performed while shifting the irradiation position by one mesh in the x direction or the y direction. First, the upper region of the stripe region is to be written. FIG. 11A shows the mesh region irradiated by the first one-shot (one shot is a total of a plurality of irradiation steps). Next, as shown in FIG. 11B, the second one-shot (one shot is a total of a plurality of irradiation steps) is performed while shifting the position in the y direction to the mesh region having not been irradiated yet. Next, as shown in FIG. 11C, the third one-shot (one shot is a total of a plurality of irradiation steps) is performed while shifting the position in the x direction to the mesh region having not been irradiated yet.

Figure 12A:
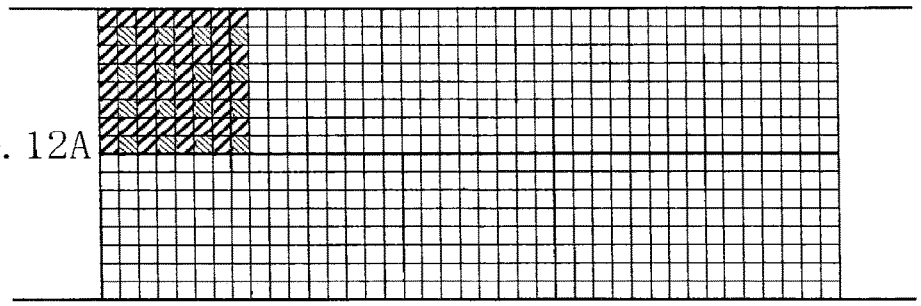
FIGS. 12A to 12C are conceptual diagrams explaining examples of a writing operation in a stripe according to the first embodiment.
Figure 12B:
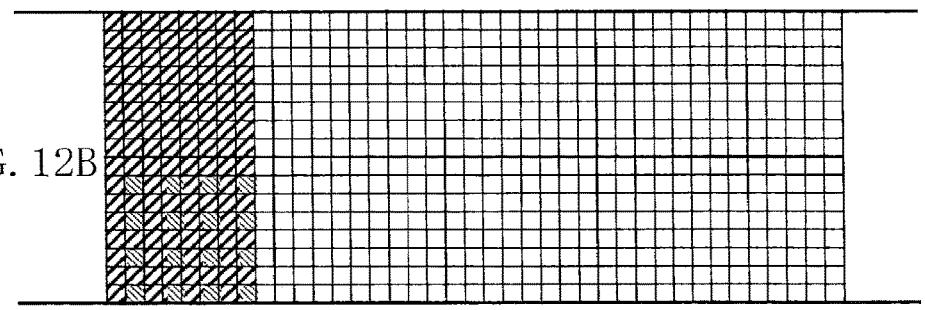
Figure 12C:
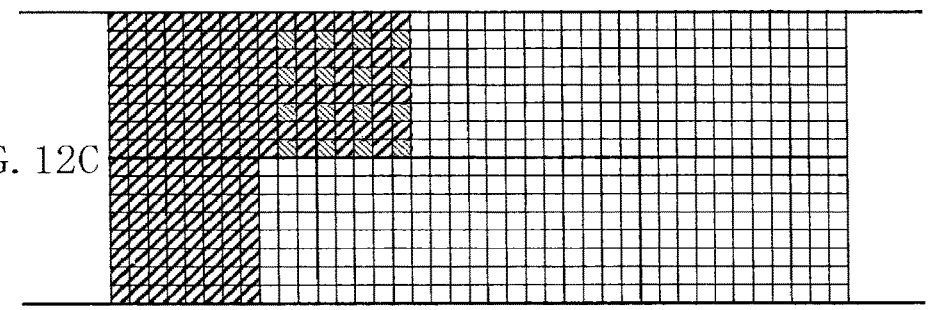

FIGS. 12A to 12C are conceptual diagrams explaining examples of a writing operation in a stripe according to the first embodiment. FIGS. 12A to 12C are continued from FIG. 11C. As shown in FIG. 12A, the fourth one-shot (one shot is a total of a plurality of irradiation steps) is performed while shifting the position in the y direction to the mesh region having not been irradiated yet. Exposure (writing) of one of irradiation regions for the whole of multiple beams is completed by these four times shots (one shot is a total of a plurality of irradiation steps). Next, the lower region of the stripe region is to be written. As shown in FIG. 12B, the lower region of the stripe region is irradiated by the first one-shot (one shot is a total of a plurality of irradiation steps). Next, the second one-shot (one shot is a total of a plurality of irradiation steps) is performed while shifting the position in the y direction to the mesh region having not been irradiated yet. Next, the third one-shot (one shot is a total of a plurality of irradiation steps) is performed while shifting the position in the x direction to the mesh region having not been irradiated yet. The fourth one-shot (one shot is a total of a plurality of irradiation steps) is performed while shifting the position in the y direction to the mesh region having not been irradiated yet. By the operations described above, writing of the first row in the stripe region in the irradiation region of multiple beams is completed. Then, as shown in FIG. 12C, writing is to be similarly performed for the second row of the multiple beam irradiation region while shifting the position in the x direction. The whole stripe region can be written by repeating the operations described above.

Figure 13A:
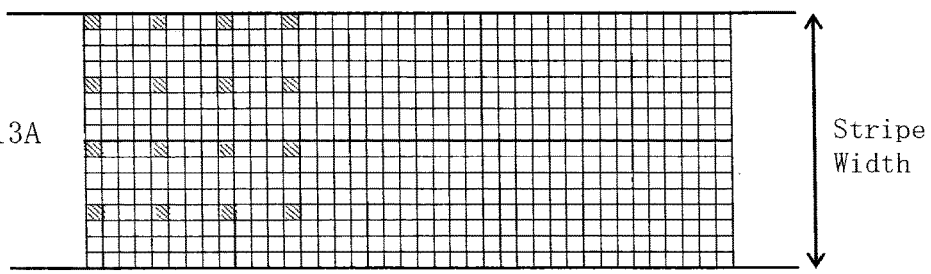
FIGS. 13A to 13C are conceptual diagrams explaining other examples of a writing operation in a stripe according to the first embodiment.
Figure 13B:
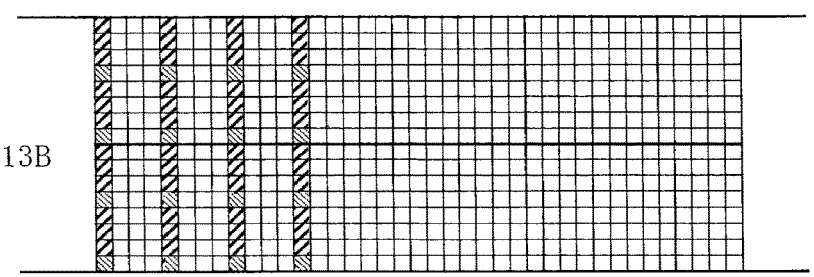
Figure 13C:
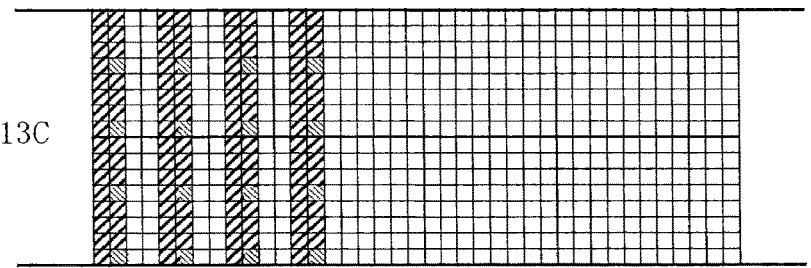

FIGS. 13A to 13C are conceptual diagrams explaining other examples of a writing operation in a stripe according to the first embodiment. FIGS. 13A to 13C show examples in which writing in a stripe is performed using 4×4 multiple beams in the x and y directions. The examples of FIG. 13A to FIG. 13C show the case where there is a distance between beams and a stripe region is divided in the y direction by a width somewhat greater than or equal to the irradiation region of the whole of multiple beams, for example. Exposure (writing) of one irradiation region by the whole of multiple beams is completed by shots of sixteen times (one shot is a total of a plurality of irradiation steps) performed while shifting the irradiation position by one mesh in the x direction or the y direction. FIG. 13A shows the mesh region irradiated by the first one-shot (one shot is a total of a plurality of irradiation steps). Next, as shown in FIG. 13B, the second one-shot, the third one-shot, and the fourth one-shot (one shot is a total of a plurality of irradiation steps) are performed while shifting the position by one mesh, one by one, in the y direction to the mesh region having not been irradiated yet. Next, as shown in FIG. 13C, the fifth one-shot (one shot is a total of a plurality of irradiation steps) is performed while shifting the position by one mesh in the x direction to the mesh region having not been irradiated yet. Next, the sixth one-shot, the seventh one-shot, and the eighth one-shot (one shot is a total of a plurality of irradiation steps) are performed while shifting the position by one mesh, one by one, in the y direction to the mesh region having not been irradiated yet.

Figure 14A:
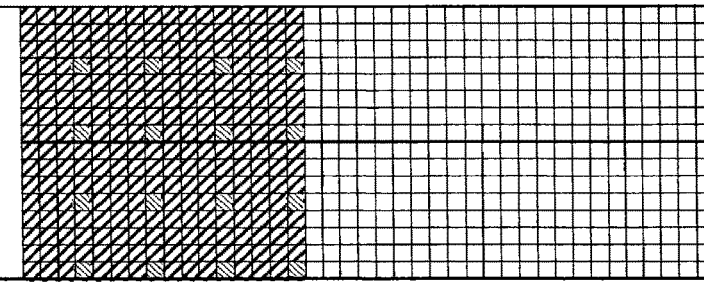
FIGS. 14A to 14C are conceptual diagrams explaining other examples of a writing operation in a stripe according to the first embodiment.
Figure 14B:
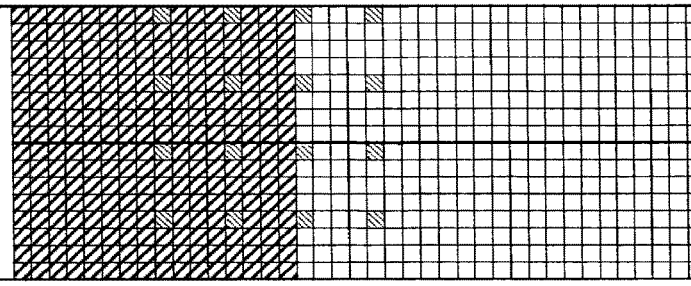
Figure 14C:
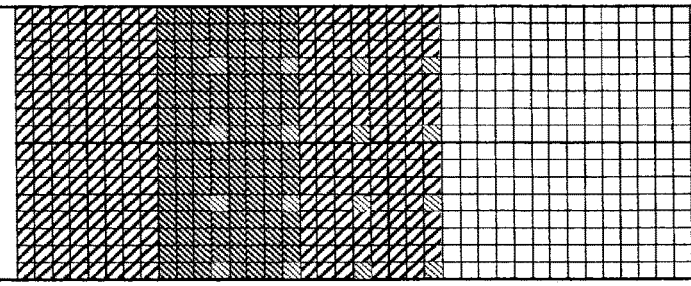

FIGS. 14A to 14C are conceptual diagrams explaining other examples of a writing operation in a stripe according to the first embodiment. FIGS. 14A to 14C are continued from FIG. 13C. As shown in FIG. 14A, the ninth one-shot to the sixteenth one-shot (one shot is a total of a plurality of irradiation steps) are repeatedly performed in order similarly to the operations of FIGS. 13A to 13C. The examples of FIGS. 13A to 13C and 14A to 14C show the case of performing multi-pass writing (multiplicity=2), for example. In such a case, the irradiation position is shifted in the x direction by about half the size of the irradiation region of the whole of multiple beams, and as shown in FIG. 14B, the first one-shot (one shot is a total of a plurality of irradiation steps) of the second layer of the multi-pass writing is performed. As described referring to FIGS. 13B and 13C, the second one-shot to the eighth one-shot (one shot is a total of a plurality of irradiation steps) of the second layer of the multi-pass writing are performed one by one, hereinafter. As shown in FIG. 14C, the ninth one-shot to the sixteenth one-shot (one shot is a total of a plurality of irradiation steps) are to be repeatedly performed in order similarly to the operations of FIGS. 13B to 13C.

As described above, according to the first embodiment, the precision of irradiation time control and, further, the precision of dose control can be improved while maintaining the restriction on a circuit installation space. Moreover, since the data amount of the logic circuit 41 of the individual blanking system is one bit, power consumption can be suppressed.

Second Embodiment

Although the first embodiment shows the case where the quantization unit Δ (a counter period of the common blanking system) is set uniquely, it is not limited thereto. The second embodiment describes the case where the quantization unit Δ is set variably. The apparatus structure according to the second embodiment is the same as that of FIG. 1. The flowchart showing main steps of a writing method according to the second embodiment is the same as that of FIG. 6. The content of the second embodiment is the same as that of the first embodiment except what is particularly described below.

FIGS. 15A to 15E are time charts for comparing the exposure waiting time according to the second embodiment. FIG. 15A shows an example of performing beam irradiation or not performing beam irradiation of each beam in each irradiation step when dividing one shot into irradiation steps of n times. In the case of dividing a shot into irradiation steps of n times, the irradiation time per shot is $(2^n-1)$ Δ at the maximum. FIG. 15A shows the case of n=10, as an example. In such a case, the irradiation time per shot is 1023 Δ at the maximum. In FIG. 15A, the irradiation time per shot is divided into irradiation steps of 10 times: 1 Δ, 2 Δ, 4 Δ, 8 Δ, 16 Δ, 32 Δ, 64 Δ, 128 Δ, 256 Δ, and 512 Δ, which are described in order from the shorter irradiation time. In FIG. 15A, irradiation steps whose irradiation time is less than 128 Δ are not shown. In FIG. 15A, the beam 1 is OFF (no beam irradiation) in the irradiation step whose irradiation time is 128 Δ, ON (beam irradiation) in the irradiation step whose irradiation time is 256 Δ, and ON (beam irradiation) in the irradiation step whose irradiation time is 512 Δ. The beam 2 is ON (beam irradiation) in the irradiation step whose irradiation time is 128 Δ, ON (beam irradiation) in the irradiation step whose irradiation time is 256 Δ, and OFF (no beam irradiation) in the irradiation step whose irradiation time is 512 Δ. The beam 3 is OFF (no beam irradiation) in the irradiation step whose irradiation time is 128 Δ, ON (beam irradiation) in the irradiation step whose irradiation time is 256 Δ, and OFF (no beam irradiation) in the irradiation step whose irradiation time is 512 Δ. The beam 4 is ON (beam irradiation) in the irradiation step whose irradiation time is 128 Δ, ON (beam irradiation) in the irradiation step whose irradiation time is 256 Δ, and OFF (no beam irradiation) in the irradiation step whose irradiation time is 512 Δ. The beam 5 is OFF (no beam irradiation) in the irradiation step whose irradiation time is 128 Δ, ON (beam irradiation) in the irradiation step whose irradiation time is 256 Δ, and OFF (no beam irradiation) in the irradiation step whose irradiation time is 512 Δ.

FIG. 15B shows an example of a total irradiation time per shot of each beam shown in FIG. 15A. FIG. 15B shows, as a comparative example, the case where the quantization unit Δ is set uniquely. Moreover, with respect to each beam shown in FIG. 15A, irradiation steps whose irradiation time is less than 128 Δ are OFF (no beam irradiation). In such a case, as shown in FIG. 15B, the total irradiation time per shot of the beam 1 is 768 Δ, for example. The total irradiation time per shot of the beam 2 is 384 Δ, for example. The total irradiation time per shot of the beam 3 is 256 Δ, for example. The total irradiation time per shot of the beam 4 is 384 Δ, for example. The total irradiation time per shot of the beam 5 is 256 Δ, for example. On the other hand, as described above, the irradiation time per shot is 1023 Δ at the maximum. When the total irradiation time per shot of each beam is shorter than the maximum irradiation time, a waiting time occurs as shown in FIG. 15B. Then, in the second embodiment, the quantization unit Δ is made to be variable in order to reduce such a waiting time.

As shown in FIG. 15C, the quantization unit Δ is set such that the maximum value of the irradiation time per shot corresponds to the total irradiation time per shot (a sum of irradiation time of irradiation steps per shot) of a beam in the case where the total irradiation time per shot of all the beams of multiple beams of all the shots is the maximum. In the example of FIG. 15B, the total irradiation time per shot of the beam 1 is 768 Δ, and is the maximum. Therefore, a quantization unit $Δ_1$ is set such that the maximum irradiation time 768 Δ per shot corresponds to 1023 $Δ_1$. Thereby, the repetition period (interval) of each shot can be shortened.

FIG. 15D shows, treating the maximum irradiation time 768 Δ as 1023 $Δ_1$, an example of irradiation or no irradiation of each beam in each irradiation step in the case of again dividing one shot into irradiation steps of ten times. In FIG. 15D, irradiation steps whose irradiation time is less than 128 Δ are not shown. Since the beam 1 in FIG. 15D is a beam being a standard of a repetition period, it is set to be in the ON state (beam irradiation) in all the irradiation steps. Since the beams 2 and 4 are 384 Δ, when converted, they become about 512 $Δ_1$. Therefore, they are ON (beam irradiation) in the irradiation step whose irradiation time is 512 $Δ_1$, and OFF (no beam irradiation) in the other irradiation steps. Since beams 3 and 5 are 256 Δ, when converted, they become 341 $Δ_1$. Therefore, they are ON (beam irradiation) in the irradiation steps whose irradiation time is 256 $Δ_1$, 64 $Δ_1$, 16 $Δ_1$, 4 $Δ_1$, or 1 $Δ_1$, and OFF (no beam irradiation) in the other irradiation steps.

In FIG. 15E, for each shot, the quantization unit Δ is set such that the maximum value of the irradiation time per shot corresponds to the total irradiation time per shot of a beam in the case where the total irradiation time per shot of all the beams of multiple beams is the maximum. In the example of FIG. 15E, the total irradiation time per shot of the first one-shot of the beam 1 is 768 Δ, which is the maximum. Therefore, the quantization unit $Δ_1$ is set such that the maximum irradiation time 768 Δ per shot corresponds to 1023 $Δ_1$. Thereby, the repetition period (interval) of the first one-shot can be shortened. Moreover, the total irradiation time per shot of the second one-shot of the beam 2 is 640 Δ, which is the maximum. Therefore, the quantization unit $Δ_2$ is set such that the maximum irradiation time 640 Δ per shot corresponds to 1023 $Δ_2$. Thereby, the repetition period (interval) of the second one-shot can be shortened. Similarly, for each shot, $Δ_3$, $Δ_4$, . . . is to be set, hereinafter.

As described above, the quantization unit Δ is made to be variable. Thereby, the waiting time can be suppressed. Therefore, writing time can be shortened. Although the case of n=10 is shown as an example in FIGS. 15A to 15E, other case, namely the case other than n=10, is also similarly applicable.

As described above, according to the second embodiment, it is possible to reduce or suppress the waiting time at the time of performing irradiation steps.

Third Embodiment

In the embodiments described above, there has been described the case of transmitting data for irradiation steps of n times in order of the amount of data from the largest, for example, but, however, it is not limited thereto. In the third embodiment, there will be described the case of transmitting data which has been made by combining data for a plurality of irradiation steps. The apparatus structure according to the third embodiment is the same as that of FIG. 1. The flowchart showing main steps of a writing method according to the third embodiment is the same as that of FIG. 6. The content of the third embodiment is the same as that of the first embodiment or the second embodiment except what is particularly described below.

The time for data transmission can be included in the irradiation time of an irradiation step by performing, in parallel, transmission of data indicating ON/OFF of the (k−1) th bit ((k−1) th digit)) of each beam and the irradiation step of the k-th bit (k-th digit) of each beam. However, since the irradiation time of an irradiation step becomes short if k becomes small, it is difficult to include the transmission of data indicating ON/OFF of the (k−1) th bit ((k−1)th digit)) in the irradiation time of the irradiation step. Then, according to the third embodiment, a digit whose irradiation time is long and a digit whose irradiation time is short are grouped. Thereby, the data transmission time of the next group can be included in the sum total of grouped irradiation time in the irradiation step. It is preferable to perform grouping by using a plurality of groups in order that the difference between totals of grouped irradiation time may become shorter. That is, for example, it is preferable to perform grouping, such as to group an n-th digit (n-th bit) and the first digit (first bit), to group the (n−1) th digit ((n−1) th bit)) and the second digit (second bit), and to group the (n−2)th digit ((n−2)th bit) and the third digit (third bit) and so on.

Figure 16:
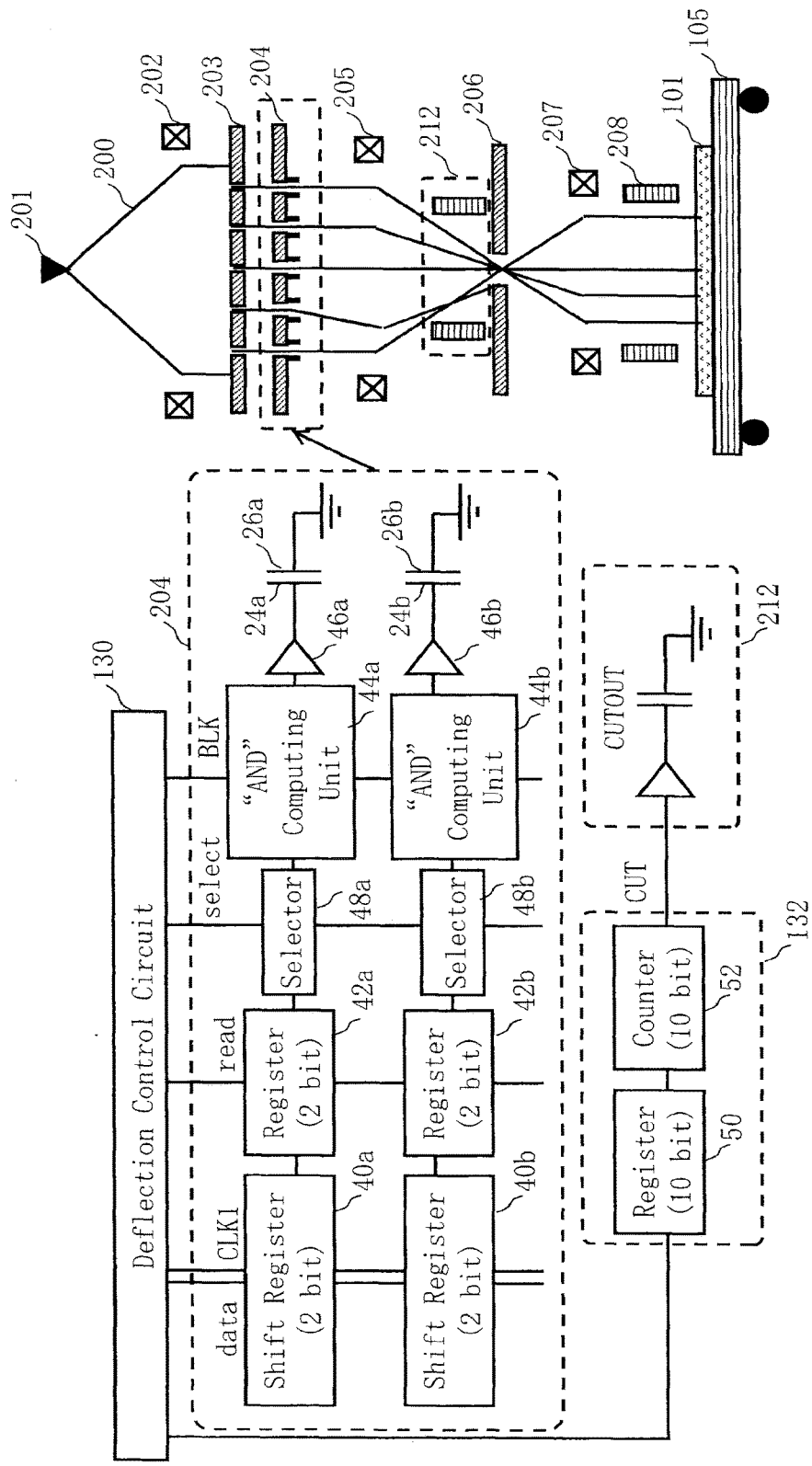
FIG. 16 is a schematic diagram showing an internal structure of an individual blanking control circuit and a common blanking control circuit according to the third embodiment.

FIG. 16 is a schematic diagram showing the internal structure of an individual blanking control circuit and a common blanking control circuit according to the third embodiment. FIG. 16 is the same as FIG. 5 except that a selector 48 is added to each logic circuit 41 for individual blanking control arranged at the blanking plate 204 in the body of the writing apparatus 100, and individual blanking control for each beam is controlled by, for example, a two-bit control signal. Here, the case of combining two irradiation steps to set one group is shown, for example. Therefore, one bit each is used as a control signal, for each irradiation step in the group. Therefore, a two-bit control signal is used for each group. Even if the control signal is two bits, the logic circuit itself of the control circuit for beam ON/OFF can be overwhelmingly small compared with a circuit in which dose control is performed using ten bits. Therefore, the installation area (of a circuit on the blanking aperture) can be made small while improving the response of blanking control (using a common blanking system). In other words, even in the case of arranging a logic circuit on the blanking plate 204 having a narrow installation space, precision of dose control can be improved while realizing a smaller beam pitch.

Figure 17:
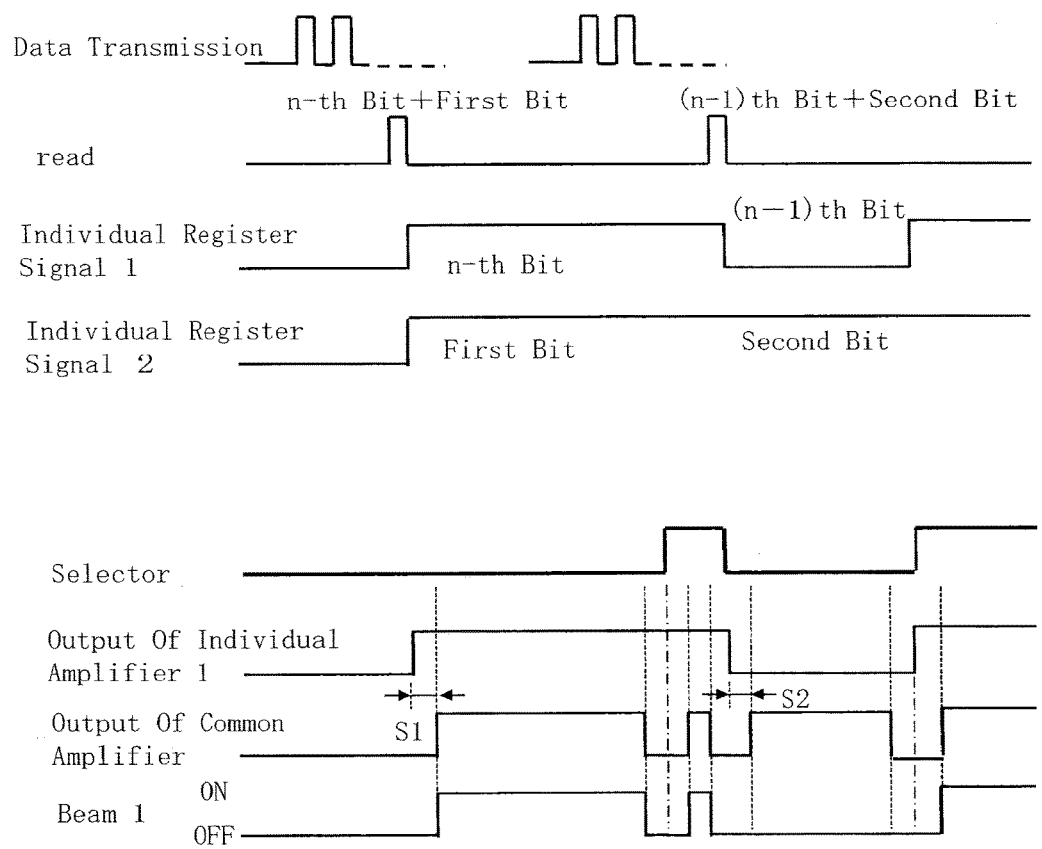
FIG. 17 is a flowchart showing a beam ON/OFF switching operation with respect to a part of an irradiation step of one shot according to the third embodiment.

FIG. 17 is a flowchart showing a beam ON/OFF switching operation with respect to a part of an irradiation step of one shot according to the third embodiment. FIG. 17 shows one beam (the beam 1) as an example in multiple beams. Irradiation steps of: from a group of the n-th bit (n-th digit) and the first bit (first digit) to a group of the (n−1) th bit ((n−1) th digit)) and the second bit (second digit) of the beam 1, are shown, for example. As for irradiation time arrangement data, there is shown the case of the n-th bit (n-th digit) being "1", the first bit (first digit) being "1", the (n−1) th bit ((n−1) th digit) being "0", and the second bit (second digit) being "1", for example.

First, in response to the input of a read signal of the group of the n-th bit (n-th digit) and the first bit (first digit), the individual register 42 (an individual register signal 1 (the n-th digit) and an individual register signal 2 (the first digit)) outputs ON/OFF signals in parallel (as parallel transmission signals), based on the stored data of the n-th bit (n-th digit) and the first bit (first digit). Since a two-bit signal is used in the third embodiment, it is necessary to select and switch a signal. Referring to FIG. 17, first, data of the individual register signal 1 is selected by the selector 48, and an ON signal of the n-th bit (the n-th digit) is output to the individual amplifier. Next, with respect to the output of the individual register 42, data of the individual register 2 is selected by the switching of the selector 48, and the output of the n-th bit (the n-th digit) is switched to the output of the first bit (the first digit). This switching is sequentially repeated for each irradiation step.

Since the data of the n-th bit (the n-th digit) is data indicating ON, the individual amplifier 46 (the individual amplifier 1) outputs an ON voltage to be applied to the blanking electrode 24 for the beam 1. On the other hand, in the logic circuit 132 for common blanking, ON/OFF is switched depending upon the timing data of ten bits of each irradiation step. In the common blanking system, an ON signal is output during the irradiation time of each irradiation step. For example, if Δ=1 ns, the irradiation time of the first irradiation step (for example, the tenth digit (the tenth bit)) is Δ×512=512 ns. The irradiation time of the second irradiation step (for example, the first digit (the first bit)) is Δ×1=1 ns. The irradiation time of the third irradiation step (for example, the ninth digit (the ninth bit)) is Δ×256=256 ns. The irradiation time of the fourth irradiation step (for example, the second digit (the second bit)) is Δ×2=2 ns. Similarly, it is ON during the irradiation time of each digit (each bit) of each group, hereafter. In the logic circuit 132, when the timing data of each irradiation step is input into the register 50, the register 50 outputs the data indicating ON of the k-th digit (the k-th bit), the counter 52 counts the irradiation time of the k-th digit (the k-th bit), and it is controlled to be OFF after the irradiation time has passed. Hereafter, beam irradiation is hereafter performed in order for each group.

As described above, according to the third embodiment, data transmission time can be included in the total grouped irradiation time in the irradiation step.

Although, in the third embodiment, the case of using the transmission channel where a two bit parallel shift register is used is described, it is also acceptable to use one bit serial transmission as long as a sufficient transmission rate can be obtained. The design of the transmission channel may be suitably selected by an engineer concerned. Moreover, although it has the structure in which two data is switched by the selector, it is also effective to perform transmission in order by using a shift register without using a selector.

Furthermore, although the configuration of the case of grouping two irradiation steps has been described as the third embodiment, it is not limited thereto. For example, if three irradiation steps are grouped, the total time of a data transmission time and a grouped irradiation time in an irradiation step can be more uniformized. If the number of grouped irradiation steps is increased, uniformity can be enhanced. For example, when the irradiation step is each digit of a binary number, if the number of irradiation steps to be grouped is three or four, a sufficient uniformity result can be acquired. However, when the number of irradiation steps is increased, the number of necessary registers is also increased, which results in increasing the circuit area. Therefore, the number of irradiation steps to be grouped is to be suitably selected according to a demand. A concrete embodiment is not limited to what is described above. Various embodiments can be selected based on the gist of the present invention that the transmission time of group data is to be included in the total grouped irradiation time in the irradiation step.

Fourth Embodiment

In each embodiment described above, each logic circuit 41 for individual blanking control is arranged on the blanking plate 204, but, however, it may be arranged outside. In the fourth embodiment, the case of arranging each logic circuit 41 for individual blanking control outside the blanking plate 204 will be described. The apparatus structure according to the fourth embodiment is the same as that of FIG. 1 except that each logic circuit 41 for individual blanking control is arranged at the outside of the blanking plate 204. The flowchart showing main steps of a writing method according to the fourth embodiment is the same as that of FIG. 6. The content of the fourth embodiment is the same as that of any one of the first to third embodiments except what is particularly described below.

Figure 18:
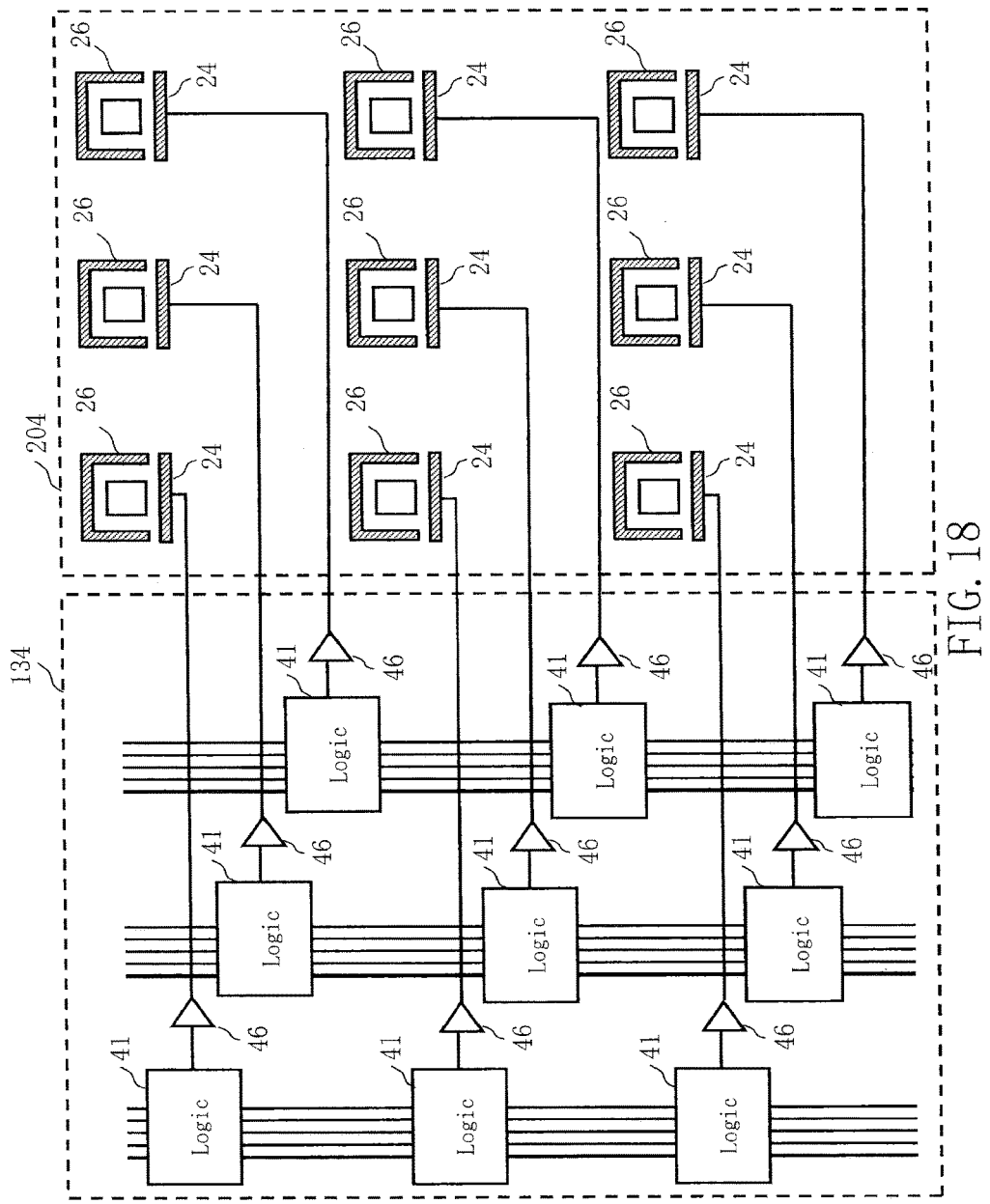
FIG. 18 is a schematic diagram explaining an arrangement state between a logic circuit and a blanking plate 204 according to the fourth embodiment.

FIG. 18 is a schematic diagram explaining the arrangement state between the logic circuit and the blanking plate 204 according to the fourth embodiment. In the fourth embodiment, each logic circuit 41 for individual blanking control and each amplifier 46 are arranged in the logic circuit 134 arranged outside the writing unit 150, and connected to each electrode 24 for individual blanking control by wiring. In such a structure, since the wiring becomes long, crosstalk and settling time increase. However, as described above, according to the fourth embodiment, since after having performed ON/OFF switching by the individual blanking system and having waited for voltage stability, ON/OFF switching is performed by the common blanking system, the irradiation time can be controlled highly accurately without being affected by crosstalk and settling time even if they increase.

Fifth Embodiment

Although, in each embodiment described above, blanking control is performed for each time irradiation step of irradiation of a plurality of times made by dividing one shot, for each beam, by using the blanking plate 204 for individual blanking control and the deflector 212 for common blanking, it is not limited thereto. In the fifth embodiment, there will be described a configuration in which blanking control is performed for each time irradiation step of a plurality of irradiation times made by dividing one shot, for each beam, by using the blanking plate 204 for individual blanking control without using the deflector 212 for common blanking.

Figure 19:
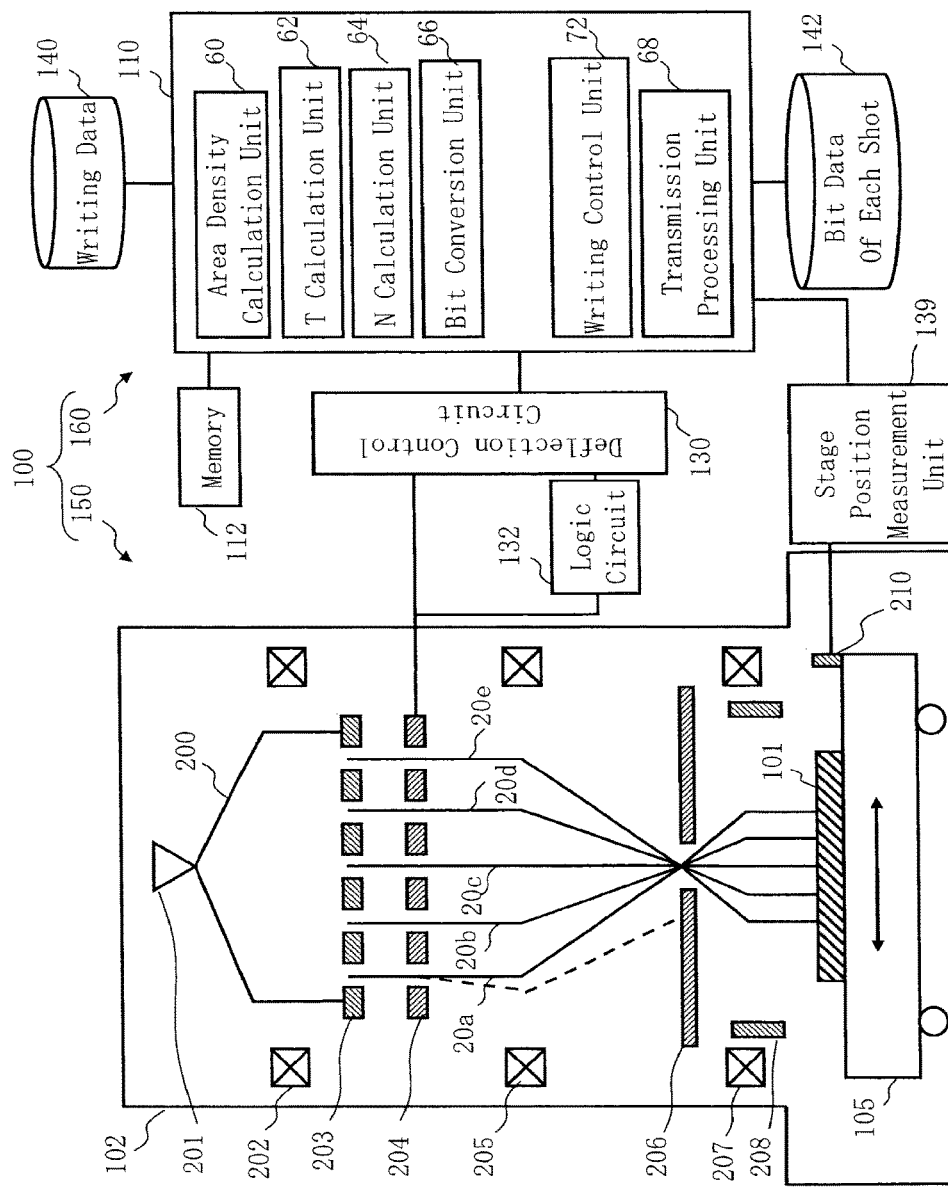
FIG. 19 is a schematic diagram showing a structure of a writing apparatus according to the fifth embodiment.

FIG. 19 is a schematic diagram showing the structure of a writing apparatus according to the fifth embodiment. FIG. 19 is the same as FIG. 1 except that the deflector 212 does not exist and output of the logic circuit 132 is connected to the blanking plate 204. Main steps of a writing method according to the fifth embodiment are the same as those of FIG. 6. The content of the fifth embodiment is the same as that of the first embodiment except what is particularly described below.

Figure 20:
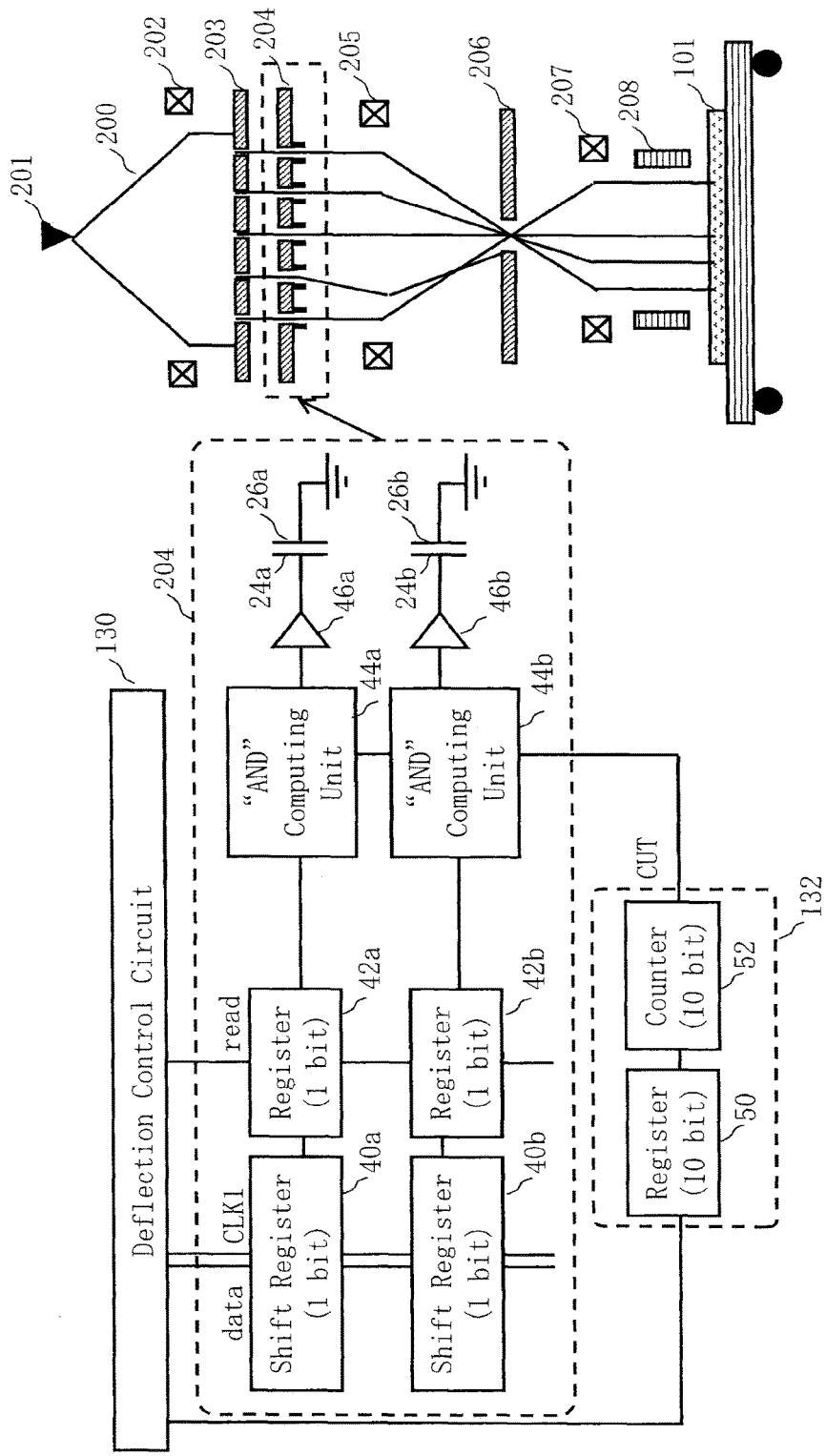
FIG. 20 is a schematic diagram showing an internal structure of an individual blanking control circuit and a common blanking control circuit according to the fifth embodiment.

FIG. 20 is a schematic diagram showing the internal structure of an individual blanking control circuit and a common blanking control circuit according to the fifth embodiment. The content of FIG. 20 is the same as that of FIG. 5 except that the deflector 212 does not exist and an output signal of the logic circuit 132 is input into the AND computing unit 44 (AND circuit) instead of a signal from the deflection control circuit 130.

In the individual beam ON/OFF switching step (S116), an ON/OFF control signal (first ON/OFF control signal) for a beam is output by the logic circuit (first logic circuit) of the beam concerned, for each beam, with respect to each time irradiation of irradiation of a plurality of times, by using a plurality of logic circuits (first logic circuit) each including the shift register 40 and the individual register 42 each respectively outputting a beam ON/OFF control signal to a corresponding beam in multiple beams. Specifically, as described above, when inputting data of the k-th bit (the k-th digit), the individual register 42 of each beam outputs an ON/OFF signal to the AND computing unit 44 based on the input data. If the data of the k-th bit (the k-th digit) is "1", an ON signal is to be output, and if it is "0", an OFF signal is to be output.

In the common beam ON/OFF switching step (S118), for each beam, with respect to each time irradiation of irradiation of a plurality of times, after a beam ON/OFF control signal has been switched by the logic circuit for individual blanking, a beam ON/OFF control signal (second ON/OFF control signal) is output so that a beam may be in the ON state during the irradiation time corresponding to the irradiation concerned, by using the logic circuit 132 (second logic circuit) which collectively outputs a beam ON/OFF control signal to the whole of multiple beams. Specifically, in the logic circuit 132 for common blanking, ON/OFF is switched depending upon ten-bit timing data of each irradiation step. The logic circuit 132 outputs an ON/OFF control signal to the AND computing unit 44. In the logic circuit 132, an ON signal is output during the irradiation time of each irradiation step.

In the blanking control step, the AND computing unit 44 performs blanking control so that a beam concerned may be in the ON state during the irradiation time corresponding to the irradiation concerned, when both the ON/OFF control signal for an individual beam and the ON/OFF control signal for a common beam are ON control signals. When both the ON/OFF control signal for an individual beam and the ON/OFF control signal for a common beam are ON control signals, the AND computing units 44 outputs an ON signal to the amplifier 46, and, then, the amplifier 46 applies an ON voltage to the electrode 24 of the individual blanking deflector. In other case, the AND computing unit 44 outputs an OFF signal to the amplifier 46, and, then, the amplifier 46 applies an OFF voltage to the electrode 24 of the individual blanking deflector. Thus, when both the ON/OFF control signal for an individual beam and the ON/OFF control signal for a common beam are ON control signals, the electrode 24 (individual blanking system) of the individual blanking deflector individually performs beam ON/OFF control so that the beam concerned may be in the ON state during the irradiation time corresponding to the irradiation concerned.

Since the individual blanking circuit is arranged in the large region of the blanking plate, time deviation is generated in operations of the individual blanking circuit because of delay by the circuit or delay by the length of wiring. However, if a beam-on signal is supplied from the common blanking when the operation of the individual blanking circuit affected by the response speed gap has been settled, it is possible to avoid unstable beam irradiation caused by delay and the like of the individual circuit.

As described above, even when the blanking plate 204 for individual blanking control is used without using the deflector 212 for common blanking, the restriction on a circuit installation space can be maintained like the first embodiment. Moreover, since the logic circuit 41 for individual blanking has a data amount of one bit, power consumption can also be suppressed. Furthermore, there is an advantage that the deflector 212 for common blanking can be omitted.

According to the present embodiment, the logic circuit 132 for common blanking may be manufactured independently, or, alternatively, it can also be manufactured, as an integrated circuit of a monolithic structure, by being arranged at the peripheral part of the blanking plate. If the logic circuit 132 for common blanking is arranged at the peripheral part of the blanking plate, the wiring length to the individual blanking circuit can be made short, which has an advantage of facilitating an exact timing control.

Although, in the example described above, the case of the logic circuit 41 for individual blanking having a data amount of one bit is described, it is not limited thereto. The structure according to the fifth embodiment can also be applied to the case of a data amount of two bits like the third embodiment. Moreover, the structure of the fifth embodiment is applicable to other embodiments.

Sixth Embodiment

Although, in each embodiment described above, the case where each divided irradiation step corresponds to each digit of a binary number is described, the way of dividing is not limited thereto. Except for the dividing way to be corresponding to each digit of a binary number, divided irradiation steps can be depending upon a combination of various different time periods or same time periods. In the sixth embodiment, there will be described the case where irradiation step division is based on a combination of various different time periods or same time periods. The apparatus structure is the same as that of FIG. 1 or FIG. 19.

Figure 21:
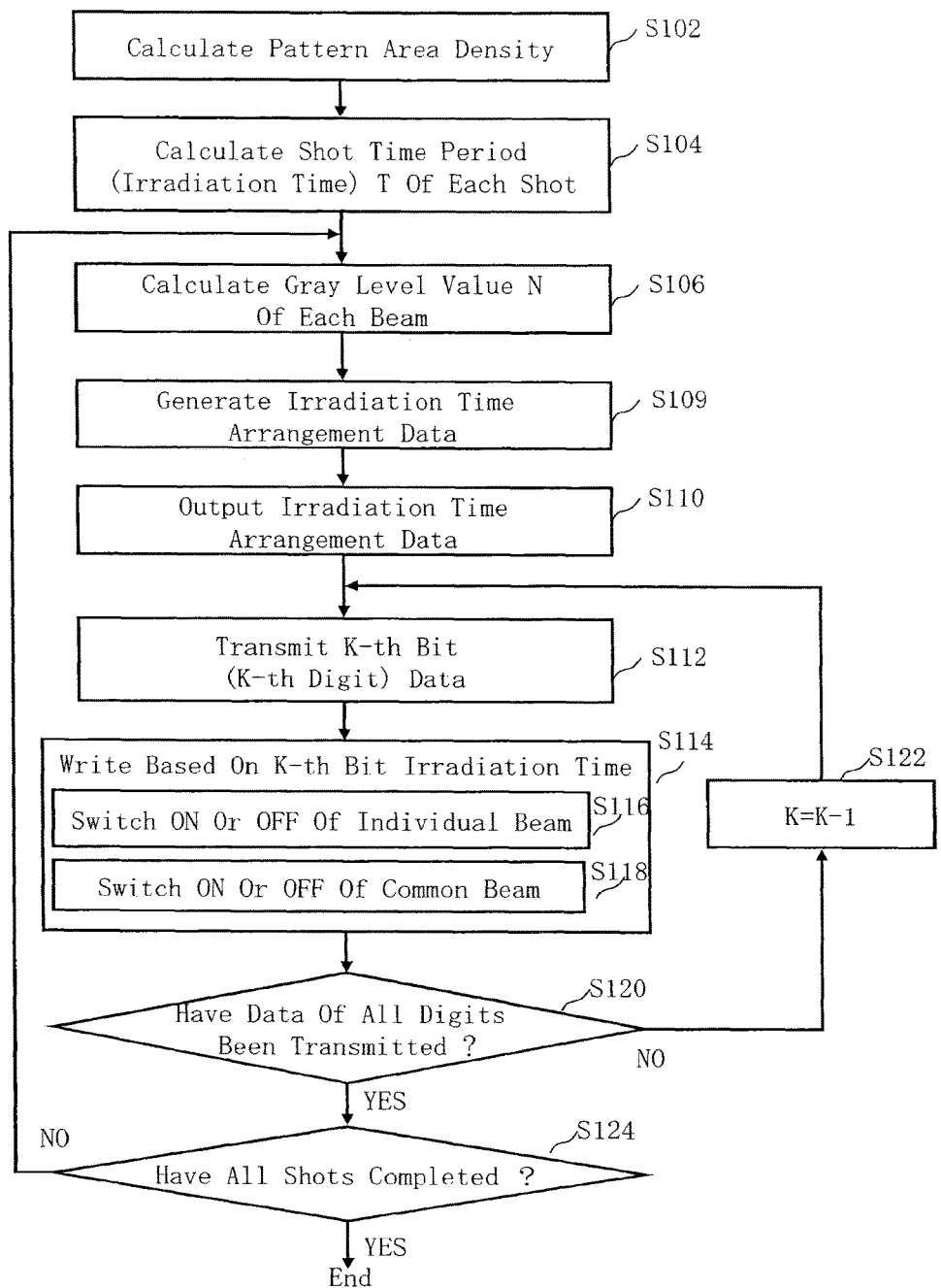
FIG. 21 is a flowchart showing main steps of a writing method according to the sixth embodiment.

FIG. 21 is a flowchart showing main steps of a writing method according to the sixth embodiment. FIG. 21 is the same as FIG. 6 except that an irradiation time arrangement data generating step (S109) is executed instead of the conversion to binary number step (S108).

The content of the present embodiment is the same as that of any one of embodiments described above except what is particularly described below.

The combination of divided irradiation time ($X0\ \Delta$, $X1\ \Delta$, $X2\ \Delta$, ..., $X(m-1)\ \Delta$) that can express an arbitrary irradiation time, which is up to the maximum irradiation time Tmax, can be selected according to the conditions described below. (Hereinafter, the divided irradiation time ($X0\ \Delta$, $X1\ \Delta$, $X2\ \Delta$, ..., $X(m-1)\ \Delta$) will just be described as a combinatorial sequence ($X0$, $X1$, $X2$, ..., $X(m-1)$) where $\Delta$ is omitted.)

First, combining can be performed based on definition of a divided irradiation time of the first digit ($k=0$) as $X0=1$ and a divided irradiation time of the k-th digit as $Xk \leq \{\Sigma(Xi)\}+1$, ($i=0$ to $(k-1)$). Xk shall be an integer of 1 or more. Here, $\{\Sigma(Xi)\}$ ($i=0$ to $(k-1)$) means ($X0+X1+...+X(k-2)+X(k-1)$) that is an added value of parenthesized Xi from $X0$ to $X(k-1)$. Hereinafter, it will be explained using the same expression.

In the conditions described above, for example, since $X=1$, X1 is either 1 or 2. When $X1=2$, X2 is one of 1 to 4. Here, in the case of X2 is 3, with respect to a combinatorial sequence ($X0$, $X2$, $X3$)=(1, 2, 3), arbitrary time setting from 0 to 6 can be performed depending upon which digit is selected (added or not added).

Considering the case of Xk, with respect to the combinatorial sequence ($X0$, ..., $X(k-1)$) of from $X0$ to $X(k-1)$, arbitrary time setting from 0 to $\Delta \cdot \{\Sigma(Xi)\}$ ($i=0$ to $(k-1)$) can be performed. Then, with respect to another combinatorial sequence ($X0$, ..., $X(k-1)$, Xk) in which Xk is added, arbitrary irradiation time setting from 0 to $\{\Sigma(Xi)\}$ ($i=0$ to $(k-1)$) can be performed when Xk is not selected, and arbitrary irradiation time setting from Xk to $Xk+\{\Sigma(Xi)\}$ ($i=0$ to $(k-1)$) can be performed when Xk is selected.

With respect to a settable region in the case of selecting Xk or not selecting Xk, if the maximum value +1 in not selecting Xk is defined as the minimum value in selecting Xk (that is, $Xk=\{\Sigma(Xi)\}+1$ ($i=0$ to $(k-1)$), the settable region becomes a setting region having a continuous value of combined Xk. Therefore, as a divided time combination of a combinatorial sequence ($X0$, ..., $X(k-1)$, Xk), it is possible to arbitrarily set time from 0 to $Xk+\{\Sigma(Xi)\}$ ($i=0$ to $(k-1)$), that is from 0 to $\{\Sigma(Xi)\}$ ($i=0$ to k).

Moreover, if defining $Xk<\{\Sigma(Xi)\}+1$ ($i=0$ to $(k-1)$), though the settable range in the case of selecting Xk or not selecting Xk overlap with each other (that is, there is an irradiation time which can be set in both the case of selecting Xk and not selecting Xk), it is acceptable to perform such selection.

Furthermore, if increasing the number of terms (digits) of Xk to m terms (digits) so that the maximum irradiation time Tmax may be $Tmax \leq \Delta \cdot \{\Sigma(Xi)\}$ ($i=0$ to $(m-1)$), namely so that it may be setup to the maximum irradiation time Tmax, the combinatorial sequence ($X0$, $X1$, $X2$, ..., $Xm-1$) becomes a combination of divided time obtained by arbitrarily setting time of from 0 to Tmax.

Here, the irradiation time T of each shot is expressed by the combination of Xi to be $T=\Delta \cdot \{\Sigma(ai \cdot Xi)\}$ ($i=0$ to $(m-1)$).

Here, ai is expressed by 1 or 0 corresponding to the case of selecting or not-selecting. Therefore, if pseudoly expressing the sequence of ai ($a0$, $a1$, $a2$, $a3$, ..., $a(m-1)$) by 0 or 1 like a binary number, it is convenient in processing.

Particularly, if defining $Xk=\{\Sigma(Xi)\}+1$ ($i=0$ to $(k-1)$), Xk ($Xk=2^k$) expressing each digit of a binary number satisfies the conditions described above, and m being the number of necessary digits can be expressed by the minimum number.

Another example satisfying the conditions described above is explained below. As an example of combining irradiation steps of the same time period, when $N=700$ in the case of $\Delta=1$ ns, it is possible to perform irradiation by combining the irradiation steps of 256 ns (beam ON), 256 ns (beam ON), 256 ns (beam OFF), 64 ns (beam ON), 64 ns (beam ON), 64 ns (beam OFF), 16 ns (beam ON), 16 ns (beam ON), 16 ns (beam ON), 4 ns (beam ON), 4 ns (beam ON), 4 ns (beam ON), 1 ns (beam OFF), 1 ns (beam OFF) and 1 ns (beam OFF). In that case, irradiation is performed by irradiation steps of fifteen times. This dividing way of irradiation steps, compared with the case where each irradiation step is corresponding to each digit of a binary number, has a possibility of a throughput decrease because the number of irradiation steps increases. However, at the same time, it has an advantage that control circuit design can be easily performed because of the repletion of the same time period. Thus, although the dividing way of the irradiation step according to each digit of a binary number has an advantage that the number of irradiation steps becomes the minimum, various combination other than what is described above can be performed. The combination type should be selected according to a demand.

In the irradiation time arrangement data generating step (S109), using a sequence of a predetermined number of terms in which each value is less than or equal to a value obtained by adding 1 to the sum of previous values up to a value just before the each value concerned, the bit conversion unit 66 respectively generates, for each shot, irradiation time arrangement data so that the total of values obtained by selecting or not selecting a value of each term of the sequence may become the irradiation time (in this case, a gray level value N) of each beam of electron multi-beams. The irradiation time arrangement data is identified, for example, by "1" when selected and by "0" when not selected. For example, using the above combinatorial sequence (1, 1, 1, 4, 4, 4, 16, 16, 16, 64, 64, 64, 256, 256, 256) of the fifteen terms, in the case of defining N=700 by Δ=1 ns, it becomes: 1 (non-selected=0), 1 (non-selected=0), 1 (non-selected=0), 4 (selected=1), 4 (selected=1), 4 (selected=1), 16 (selected=1), 16 (selected=1), 16 (selected=1), 64 (non-selected=0), 64 (selected=1), 64 (selected=1), 256 (non-selected=0), 256 (selected=1), and 256 (selected=1). For example, when performing irradiation sequentially from the larger (longer) value (irradiation time), the irradiation time arrangement data of N=700 can be defined as "110110111111000". Although, values are arranged, in this case, from the larger to the smaller as an example, it is also preferable to define from the smaller to the larger, in accordance with the original order of the sequence, as "000111111011011". It should be understood that the irradiation time indicated by each digit (term) of the irradiation time arrangement data is related with the value of each term of the pre-set sequence.

As described above, each shot is not restricted to the value of each digit of a binary number, and may be divided into a plurality of irradiation steps by combination of irradiation time of other sequence values.

In the writing step (S114) based on irradiation time on the irradiation time of a target digit (for example, the k-th bit (k-th digit)) in the irradiation divided into a plurality of irradiation steps. Thus, for each beam shot, irradiation of a beam concerned is divided into irradiation performed the number of times equal to the number of terms of a sequence, wherein the sequence is equivalent to a combination of irradiations of the irradiation time periods of the terms each indicating an irradiation time period of a corresponding value of the sequence, and based on the irradiation time arrangement data, irradiation is performed onto the target object by, in order, irradiating a beam of the irradiation time period corresponding to the value of each selected term.

Moreover, as described in the third embodiment, it is also preferable to have a structure in which data for a plurality of irradiation steps are combined to be transmitted. In other words, as to irradiation performed the number of times equal to the number of sequence digits, it is preferable to set a plurality of groups composed of a plurality of values each being a value of each digit of a sequence, and then, beam irradiation is performed for each group in order. Thereby, the data transmission time of the next group can be included in the total of grouped irradiation time in an irradiation step. Like the third embodiment, it is preferable to set a plurality of groups so that the difference between the totals of grouped irradiation time may be more uniform. For example, it is preferable to perform grouping, such as a group of the n-th digit (n-th bit) and the first digit (first bit), a group of the (n−1)th digit ((n−1)th bit) and the second digit (second bit), a group of the (n−2) th digit ((n−2) bit) and the third digit (third bit) . . . and so on.

The embodiments have been explained referring to concrete examples described above. However, the present invention is not limited to these specific examples.

Although, in the structure according to embodiments described above, the limiting aperture member 206 is arranged in the upstream part of the deflector 208 in the electron lens barrel, it is not limited thereto. For example, the limiting aperture member 206 may be arranged in the downstream part of the deflector 208, or between deflectors when a multiple stage deflector is used. In such a structure, it should be configured so that, when a beam is deflected by the deflector 208, the beam current amount blocked by the aperture member may be sufficiently small, and, on the other hand, when blanking deflection is performed, it should be designed so that a beam may be sufficiently blocked because the orbit deviates largely and so that, at the position of the aperture member 206, the deviation amount of the beam orbit by blanking deflection may become larger than the deviation amount of the beam orbit by the deflector. The structure of the electron lens barrel is not limited to what is described in the above embodiments, it should be appropriately selected.

Moreover, while the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A multi charged particle beam writing method comprising:
converting with a circuit, for each shot of multi-beams collectively, an irradiation time of each beam in multiple beams each using a charged particle beam into a binary number whose number of digits is a predetermined number;
dividing with a circuit, for each shot of each beam of the multiple beams, irradiation of a beam of the multiple beams in the each shot of the multi-beams collectively, into a plurality of sub irradiations of a number of times equal to the number of digits, where the plurality of the sub irradiations of the number of times equal to the number of digits is equivalent to a combination of irradiations of irradiation time periods of the digits each indicating an irradiation time period defined by a decimal number converted from the converted binary number of a corresponding digit, the plurality of the sub irradiations being performed by beams passing through a same opening of a plurality of openings for performing a blanking control of the multiple beams; and irradiating with a writing mechanism, the beam of the irradiation time period corresponding to the each digit onto a target object in order.

2. The method according to claim 1, wherein the irradiating the beam onto the target object includes performing ON/OFF switching of a beam by an individual blanking system for the beam concerned, for each beam in multi-beams, with respect to each time irradiation of the plurality of the sub irradiations of the number of times equal to the number of digits, by using a plurality of individual blanking systems that respectively perform beam ON/OFF control of a corresponding beam in the multi-beams; and performing blanking control, in addition to the performing ON/OFF switching of the beam for the each beam by the individual blanking system, with respect to the each time irradiation of the plurality of the sub irradiations of the number of times equal to the number of digits, so that the beam is in an ON state during an irradiation time corresponding to irradiation of a digit concerned, by using a common blanking system that collectively performs beam ON/OFF control for a whole of the multi-beams.

3. The method according to claim 1, further comprising grouping, with a circuit, with respect to the plurality of the sub irradiations of the number of times equal to the number of digits, a digit whose irradiation time is long and another digit whose irradiation time is short to set a plurality of groups so that difference between totals of grouped irradiation time becomes shortest in the plurality of groups, wherein beam irradiation is performed, in order, for each of the plurality of groups.

* * * * *